(12) United States Patent
Ohta et al.

(10) Patent No.: US 11,536,784 B2
(45) Date of Patent: Dec. 27, 2022

(54) MAGNETIC SENSOR AND METHOD OF MANUFACTURING SUCH

(71) Applicant: TDK Corporation, Tokyo (JP)

(72) Inventors: Naoki Ohta, Tokyo (JP); Hiroshi Yamazaki, Tokyo (JP); Satoshi Miura, Tokyo (JP); Kenkichi Anagawa, Tokyo (JP); Yosuke Komasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/498,165

(22) Filed: Oct. 11, 2021

(65) Prior Publication Data

US 2022/0128637 A1   Apr. 28, 2022

(30) Foreign Application Priority Data

Oct. 28, 2020   (JP) .............................. JP2020-180705

(51) Int. Cl.
*G01R 33/09* (2006.01)
*H01L 43/12* (2006.01)

(52) U.S. Cl.
CPC ......... *G01R 33/096* (2013.01); *G01R 33/093* (2013.01); *G01R 33/098* (2013.01); *H01L 43/12* (2013.01)

(58) Field of Classification Search
CPC ... G01R 33/096; G01R 33/093; G01R 33/098
See application file for complete search history.

(56) References Cited

U.S. PATENT DOCUMENTS

| | | | |
|---|---|---|---|
| 2002/0067581 A1* | 6/2002 | Hiramoto | B82Y 10/00 257/E27.005 |
| 2004/0239321 A1* | 12/2004 | Kobayashi | G01R 33/09 324/252 |
| 2005/0174112 A1 | 8/2005 | Wakabayashi et al. | |
| 2009/0284254 A1* | 11/2009 | Kasajima | G01R 33/09 324/252 |
| 2013/0127454 A1* | 5/2013 | Ungaretti | G01R 33/0206 324/251 |
| 2013/0134969 A1* | 5/2013 | Ohta | G01R 33/093 324/252 |

FOREIGN PATENT DOCUMENTS

JP   2004-165362 A   6/2004
JP   2005-223221 A   8/2005

* cited by examiner

*Primary Examiner* — Alvaro E Fortich
(74) *Attorney, Agent, or Firm* — Posz Law Group, PLC

(57) ABSTRACT

A magnetic sensor comprising a resin layer having a first surface and a second surface, which is opposite to the first surface and a magnetoresistive effect unit that detects a magnetic field in a predetermined direction, wherein the magnetoresistive effect unit includes at least a first magnetoresistive effect unit that detects a magnetic field in a first direction, the first direction is a direction orthogonal to the first surface of the resin layer, an inclined surface that is inclined at a predetermined angle with respect to the first surface is formed in the first surface of the resin layer, and the first magnetoresistive effect unit is formed in the inclined surface.

20 Claims, 13 Drawing Sheets

MAGNETIC SENSOR AND METHOD OF MANUFACTURING SUCH

CROSS REFERENCE TO RELATED APPLICATION

This application is based on and claims priority to Japanese Patent Application No. 2020-180705 filed on Oct. 28, 2020, the disclosure of which is incorporated herein by reference.

TECHNICAL HELD

The present invention relates to a magnetic sensor and a method of manufacturing such.

BACKGROUND

In the past, as a magnetic sensor for detecting a magnetic field in a prescribed direction, a magnetic sensor has been known in which a magnetic detection element, such as a magnetoresistive effect element or a Hall element, for example, is provided on a substrate such that the magnetism direction of the magnetic detection element is caused to match the magnetic field direction of the magnetic field to be detected (the detected magnetic field). By causing the magnetic field direction of each detected magnetic field and the magnetism direction of each magnetic detection element to match, it is possible to detect the magnetic field in a prescribed direction.

As a magnetic sensor for detecting magnetic fields in three mutually orthogonal axial directions (X axis, Y axis and Z axis), Patent Literature 1 discloses a three-axis magnetic sensor having at least three Hall elements on a flexible substrate, so that by bending the flexible substrate, the respective Hall elements can detect magnetic fields in the X-axis direction, Y-axis direction and Z-axis direction. In addition, Patent Literature 2 discloses a magnetic detection device having a Hall element forming unit in which a Hall element is formed on the main surface side of a semiconductor substrate, and a pedestal arranged on the back surface of the semiconductor substrate and holding the semiconductor substrate and the Hall element forming unit, such that the pedestal has an inclined surface at an inclined direction with respect to the holding surface of the semiconductor substrate, and the Hall element forming part is held on the inclined surface.

PATENT LITERATURE

PATENT LITERATURE 1 JP Laid-Open Patent Application No. 2004-165362
PATENT LITERATURE 2 JP Laid-Open Patent Application No. 2005-223221 OVERVIEW OF THE INVENTION

Problem to be Solved by the Invention

In the three-axis magnetic sensor disclosed in Patent Literature 1, by bending the flexible substrate, the three Hall elements can detect magnetic fields in the X-axis direction. Y-axis direction and Z-axis direction, respectively. On the other hand, in the aforementioned conventional three-axis magnetic sensor, it is possible for the three Hall elements to detect magnetic fields in a prescribed direction by bending the flexible substrate, but with magnetic sensors required to have a low profile, the bending angle of the flexible substrate is uniquely determined by the angle at which each of the Hall elements can detect the magnetic fields in each of the three directions, so the size of the magnetic sensor is uniquely determined by the size of the bent flexible substrate, making it difficult to further reduce the profile of the magnetic sensor.

By forming an inclined surface on the pedestal and holding the Hall element forming unit on the inclined surface, the magnetic detection device in Patent Literature 2 can detect magnetic field components in the planar direction of the inclined surface on which the Hall element is arranged. On the other hand, to form the inclined surface on the pedestal made of a semiconductor substrate, the inclined surface is formed in the wafer process, but when coating with photoresist thereafter, nonuniformity may increase and yields may deteriorate, so forming the inclined surface on the pedestal made of the semiconductor substrate is difficult.

In consideration of the foregoing, it is an object of the present invention to provide a magnetic sensor capable of detecting a magnetic field in a prescribed direction with high accuracy and capable of having a lower profile, and a method of manufacturing such.

Means for Solving the Problem

To achieve the above object, the present invention provides a magnetic sensor comprising: a resin layer having a first surface and a second surface, which is opposite to the first surface; and a magnetoresistive effect unit that detects a magnetic field in a predetermined direction; wherein the magnetoresistive effect unit includes at least a first magnetoresistive effect unit that detects a magnetic field in a first direction; the first direction is a direction orthogonal to the first surface of the resin layer; an inclined surface that is inclined at a predetermined angle with respect to the first surface is formed in the first surface of the resin layer; and the first magnetoresistive effect unit is formed in the inclined surface.

The magnetoresistive effect unit may further include a second magnetoresistive effect unit that detects a magnetic field in a second direction, the second direction may be a direction parallel to the first surface of the resin layer, one of the inclined surfaces may be formed in the first surface of the resin layer, and the first magnetoresistive effect unit and the second magnetoresistive effect unit may be provided on the one inclined surface. The inclined surface may include a first inclined surface and a second inclined surface having different inclination directions from each other, and the first magnetoresistive effect unit and the second magnetoresistive effect unit may be provided on the first inclined surface or the second inclined surface. The inclined surface may include a first inclined surface and a second inclined surface having different inclination directions from each other, the first magnetoresistive effect unit may be provided on the first inclined surface, and the second magnetoresistive effect unit may be provided on the second inclined surface, and one side of the outer periphery of the first inclined surface and one side of the outer periphery of the second inclined surface may be shared.

The magnetoresistive effect unit may further include a third magnetoresistive effect unit that detects the magnetic field in a third direction, the third direction may be a direction parallel to the first surface of the resin layer and a direction orthogonal to the second direction, the inclined surface may further include a third inclined surface with an inclination direction differing from both the inclination direction of the first inclined surface and the inclination direction of the second inclined surface, and the third magnetoresistive effect unit may be provided on the third inclined surface; and one side of the outer periphery of the third inclined surface and one side of the outer periphery of the first inclined surface may be shared, and one side of the outer periphery of the third inclined surface other than the one shared with the one side of the first inclined surface and one side of the outer periphery of the second inclined surface may be shared.

The inclined surface may be inclined from the first surface of the resin layer toward the second surface, the inclined surface may be inclined in a direction protruding from the first surface of the resin layer, the magnetoresistive effect unit may include a magnetoresistive effect element having at least an antiferromagnetic layer made of an antiferromagnetic material, the resin layer may be made of a thermoplastic resin, and the softening temperature of the thermoplastic resin may be lower than the Néel temperature of the antiferromagnetic material.

The magnetic sensor may further comprise a substrate having a first surface and a second surface, which is opposite to the first surface, wherein the resin layer is provided on the first surface of the substrate, and the second surface of the resin layer is located closer to the first surface of the substrate than the first surface of the resin layer. The substrate may be a silicon substrate, and the magnetic sensor may further comprise a sealing unit that integrally seals the resin layer and the magnetoresistive effect unit.

In addition, the present invention provides a method of manufacturing a magnetic sensor including: a step for forming a resin material layer having a first surface and a second surface, which is opposite to the first surface; a step for providing a magnetoresistive effect unit on the first surface of the resin material layer; and a step for forming an inclined surface inclined at a predetermined angle with respect to the first surface, on the first surface of the resin material layer; wherein the magnetoresistive effect unit includes at least a first magnetoresistive effect unit that detects a magnetic field in a first direction, the first direction is a direction orthogonal to the first surface of the resin layer, and the inclined surface is formed so that the first magnetoresistive effect unit provided on the first surface of the resin layer is positioned on the inclined surface.

In addition, the present invention provides a method of manufacturing a magnetic sensor including: a step for forming a resin material layer having a first surface and a second surface, which is opposite to the first surface, a step for forming an inclined surface inclined at a predetermined angle with respect to the first surface, on the first surface of the resin material layer, and a step for providing a magnetoresistive effect unit on the inclined surface, wherein the magnetoresistive effect unit includes at least a first magnetoresistive effect unit that detects a magnetic field in a first direction, and the first direction is a direction orthogonal to the first surface of the resin layer.

The magnetoresistive effect unit may further include a second magnetoresistive effect unit that detects a magnetic field in a second direction, the second direction is a direction parallel to the first surface of the resin layer, the inclined surface may include a first inclined surface and a second inclined surface with inclination directions different from each other, and the first magnetoresistive effect unit may be provided on the first inclined surface and the second magnetoresistive effect unit is provided on the second inclined surface. The magnetoresistive effect unit may further include a third second magnetoresistive effect unit that detects a magnetic field in a third direction, the third direction is a direction parallel to the first surface of the resin layer and is a direction orthogonal to the second direction, the inclined surface may further include a third inclined surface with an inclination direction differing from both the inclination direction of the first inclined surface and the inclination direction of the second inclined surface, and the third magnetoresistive effect unit may be provided on the third inclined surface.

The resin material layer may be made of a thermoplastic resin, and the inclined surface may be formed by softening the thermoplastic resin and then pressing a template having an uneven surface including an inclined surface corresponding to the inclined surface into the resin material layer. The magnetoresistive effect unit may include a magnetoresistive effect element having at least an antiferromagnetic layer made of an antiferromagnetic material, the softening temperature of the thermoplastic resin may be lower than the Néel temperature of the antiferromagnetic material, and the thermoplastic resin may be softened by heating to a temperature that is at least as great as the softening temperature of the thermoplastic resin and less than the Néel temperature of the antiferromagnetic material. The magnetoresistive effect element may be a GMR element or a TMR element. The method of manufacturing a magnetic sensor may further include a step for preparing a substrate having a first surface and a second surface, which is opposite to the first surface, wherein the resin material layer is formed on the first surface of the substrate.

Efficacy of the Invention

With the present invention, it is possible to provide a magnetic sensor capable of detecting a magnetic field in a prescribed direction with high accuracy and capable of having a lower profile, and a method of manufacturing such.

BEST MODE FOR IMPLEMENTING THE INVENTION

Figure 1A:
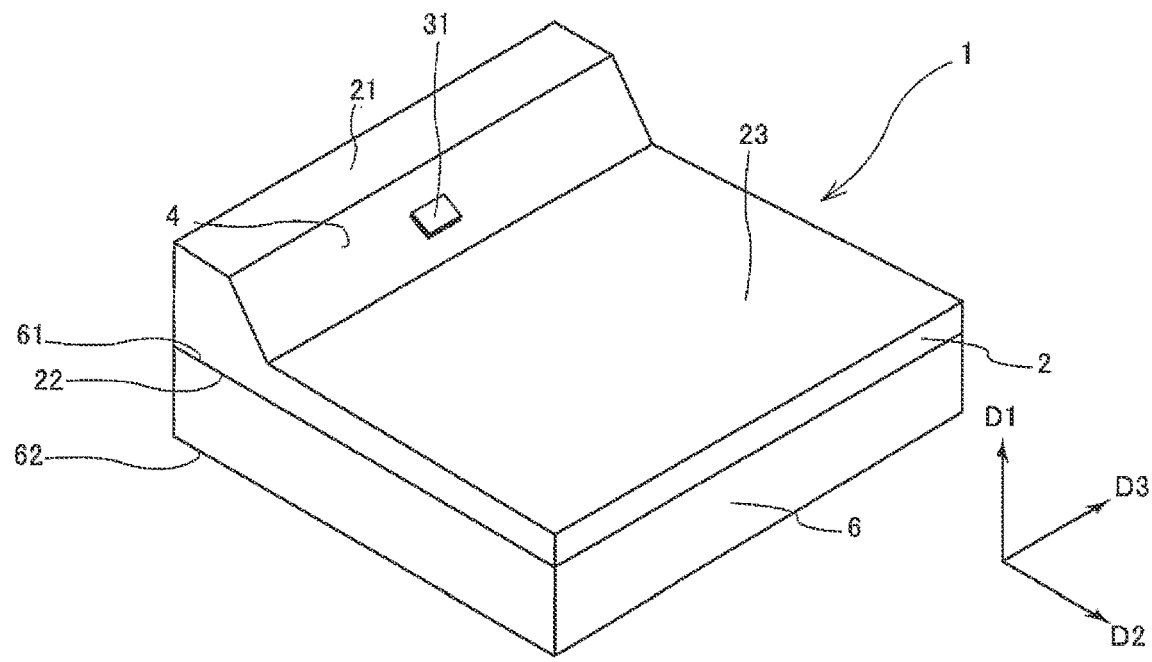
FIG. 1A is a perspective view showing the schematic configuration of a magnetic sensor according to an embodiment of the present invention.

Below, an embodiment of the present invention will be described with reference to the drawings. The drawings are schematic or conceptual, and the dimensions of each member, the ratio of the sizes between the members, and so forth, are not necessarily the same as the actual ones, and in some cases may represent the same members, or the like, and in some cases the dimensions and ratios may differ from each other depending on the drawing. In addition, in the drawings attached to this specification, the shape, scale, aspect ratio, and the like, of each part may be changed or exaggerated from the actual product to facilitate understanding.

In this embodiment, "first direction, second direction and third direction" are defined as necessary. Here, the first direction is a direction orthogonal to a first surface of the resin layer. The second direction is a direction parallel to the first surface of the resin layer. The third direction is a direction orthogonal to the first direction and the second direction. The magnetic sensor according to the present embodiment detects magnetic fields in the first direction, the second direction, and the third direction.

Figure 2:
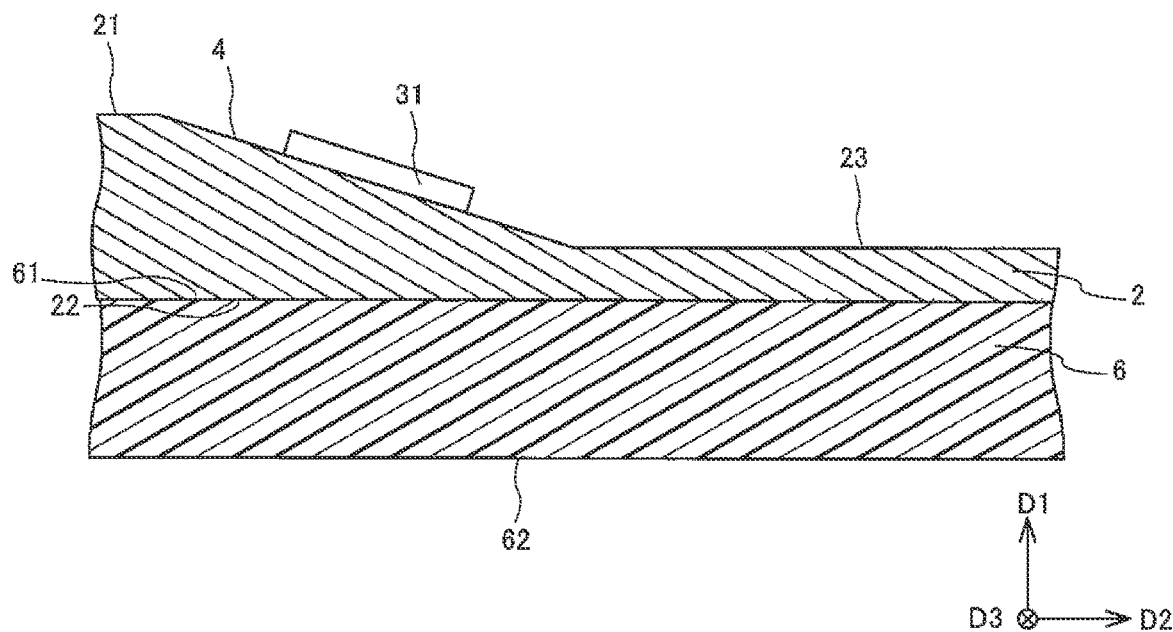
FIG. 2 is a partial, enlarged cross-sectional end view showing the schematic configuration when the magnetic sensor shown in FIG. 1A is viewed along a third direction.

FIG. 1A is a perspective view showing a schematic configuration of a magnetic sensor according to an embodiment of the present invention, and FIG. 2 is a partial, enlarged cross-sectional end view showing a schematic configuration of an inclined surface of the magnetic sensor shown in FIG. 1A.

As shown in FIG. 1A and FIG. 2, the magnetic sensor 1 according to the present embodiment has a substrate 6 having a first surface 61 and a second surface 62, which is opposite to the first surface 61, a resin layer 2 provided on the first surface 61 of the substrate 6, and a magnetoresistive effect unit 3 that detects a magnetic field in a predetermined direction. The substrate 6 may be, for example, a semiconductor substrate, such as a silicon substrate or the like, a glass substrate, such as a quartz glass substrate or the like, or a resin substrate, such as a polyethylene terephthalate substrate or the like.

The resin layer 2 has a first surface 21 and a second surface 22, which is opposite to the first surface 21. The second surface 22 of the resin layer 2 is in contact with the first surface 61 of the substrate 6. The first surface 21 of the resin layer 2 is formed with an inclined surface 4 that is inclined at a predetermined angle with respect to the first surface 21. An adhesive layer composed of an adhesive such as an insulating paste or a conductive paste or the like may be interposed between the second surface 22 of the resin layer 2 and the first surface 61 of the substrate 6.

The resin forming the resin layer 2 may be, for example, a thermoplastic resin, such as a novolac resin or a polyimide or the like, or an ultraviolet curable resin, such as an acrylic resin or the like. When the resin layer 2 is composed of the aforementioned thermoplastic resin, the softening temperature of the thermoplastic resin may be lower than the Néel temperature of the antiferromagnetic material comprising an antiferromagnetic layer 524 (see FIG. 7) possessed by a magnetoresistive element 5 (see FIG. 6 and FIG. 7) included in the magnetoresistive effect unit 3, or may be higher than the Néel temperature. As will be described later, in the method for manufacturing a magnetic sensor according to the present embodiment, a resin layer 2 having an inclined surface 4 is formed by softening the resin material layer 7 made of a thermoplastic resin and pressing a template 10 against the resin material layer 7 (see FIG. 9C, FIG. 10, and so forth). When the resin material layer 7 is heated and softened with the magnetoresistive effect unit 3 provided on the resin material layer 7 (see FIG. 9C), if the softening temperature of the thermoplastic resin is higher than the Néel temperature of the antiferromagnetic material, the magnetic material comprising the antiferromagnetic layer 524 of the magnetoresistive effect element 5 becomes paramagnetic because of an increase in entropy due to heat, creating concerns that it will not be possible to fix the magnetization direction of a magnetization fixed layer 523 (see FIG. 7), In the present embodiment, the softening temperature of the thermoplastic resin means the temperature at which the resin material layer 7 can be softened to the extent that it can be shaped (the inclined surface 4 can be formed) using the below-described template 10 (see FIG. 9C). The softening temperature can be measured using, for example, a TM413 (product name) manufactured by Ueshima Seisakusho Co., Ltd.

The magnetoresistive effect unit 3 includes a first magnetoresistive effect unit 31 that detects a magnetic field in a first direction D1, By including the first magnetoresistive effect unit 31, it becomes possible to detect the magnetic field in the first direction D1. In the present embodiment, the case where the magnetoresistive effect unit 3 includes the first magnetoresistive effect unit 31 will be described as an example, but the present invention is not limited thereto. Depending on the application of the magnetic sensor 1, for example, the magnetoresistive effect unit 3 may include a first magnetoresistive effect unit 31, a second magnetoresistive effect unit 32 that detects a magnetic field in a second direction D2, and/or a third magnetoresistive effect unit 33 that detects a magnetic field in a third direction D3.

Figure 1B:
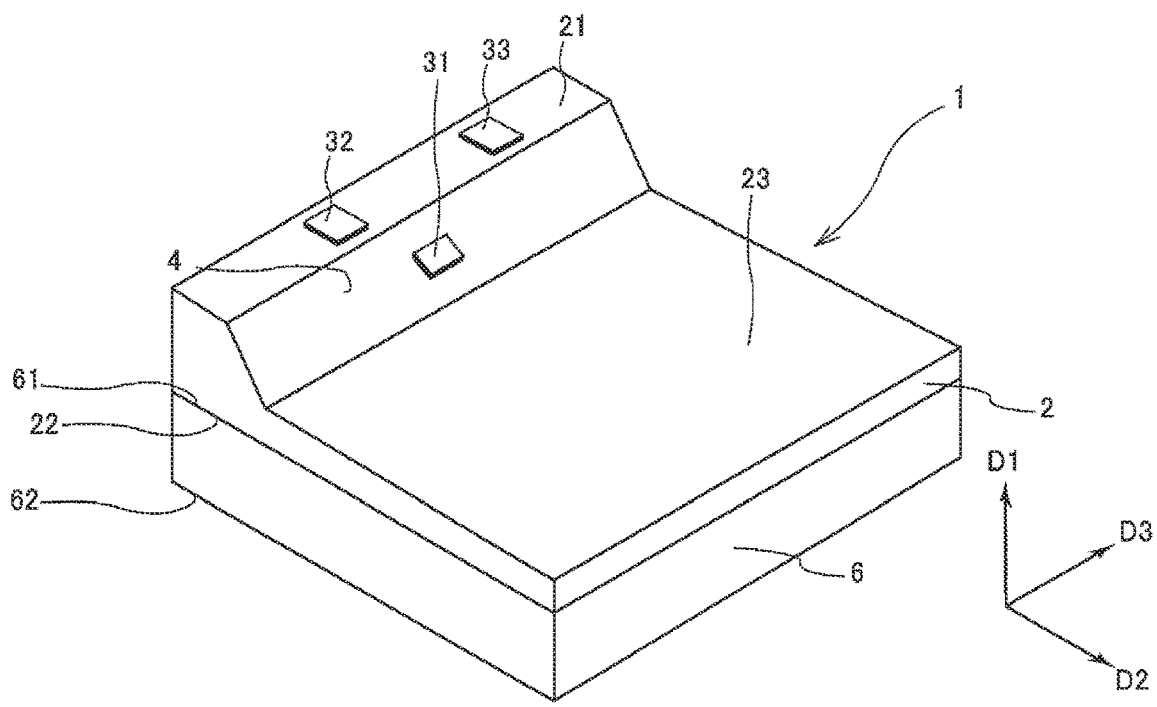
FIG. 1B is a perspective view showing the schematic configuration of another aspect of the magnetic sensor according to an embodiment of the present invention.
Figure 1C:
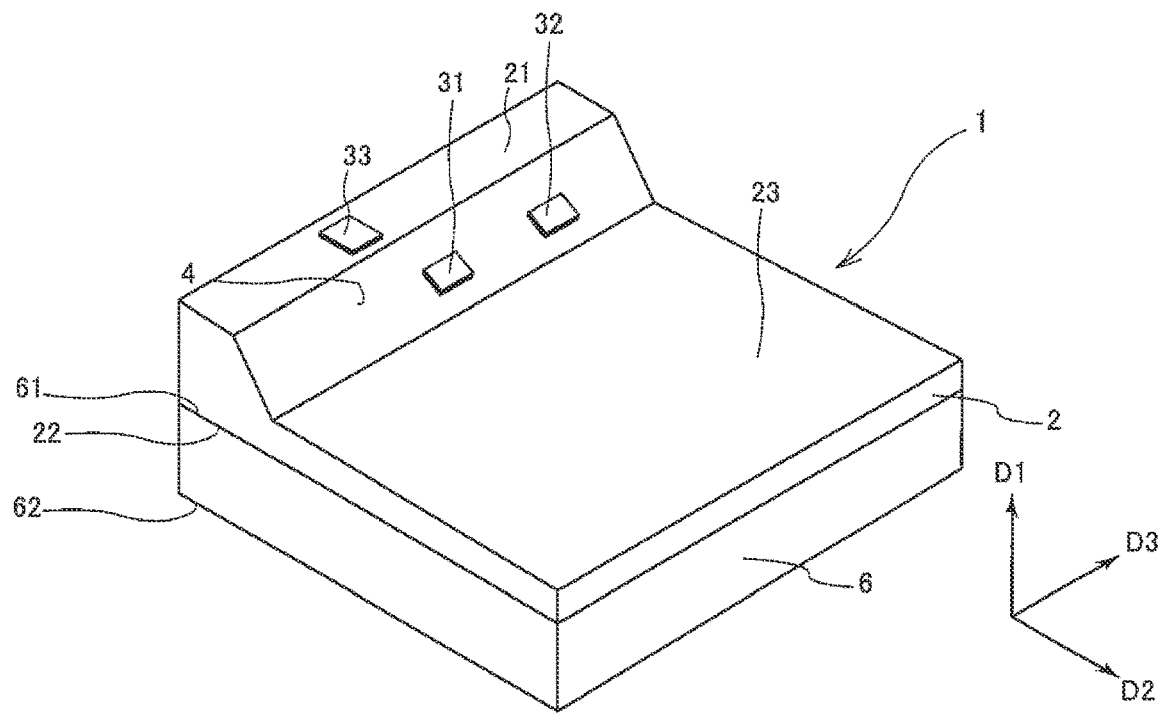
FIG. 1C is a perspective view showing the schematic configuration of another aspect of the magnetic sensor according to an embodiment of the present invention.
Figure 1D:
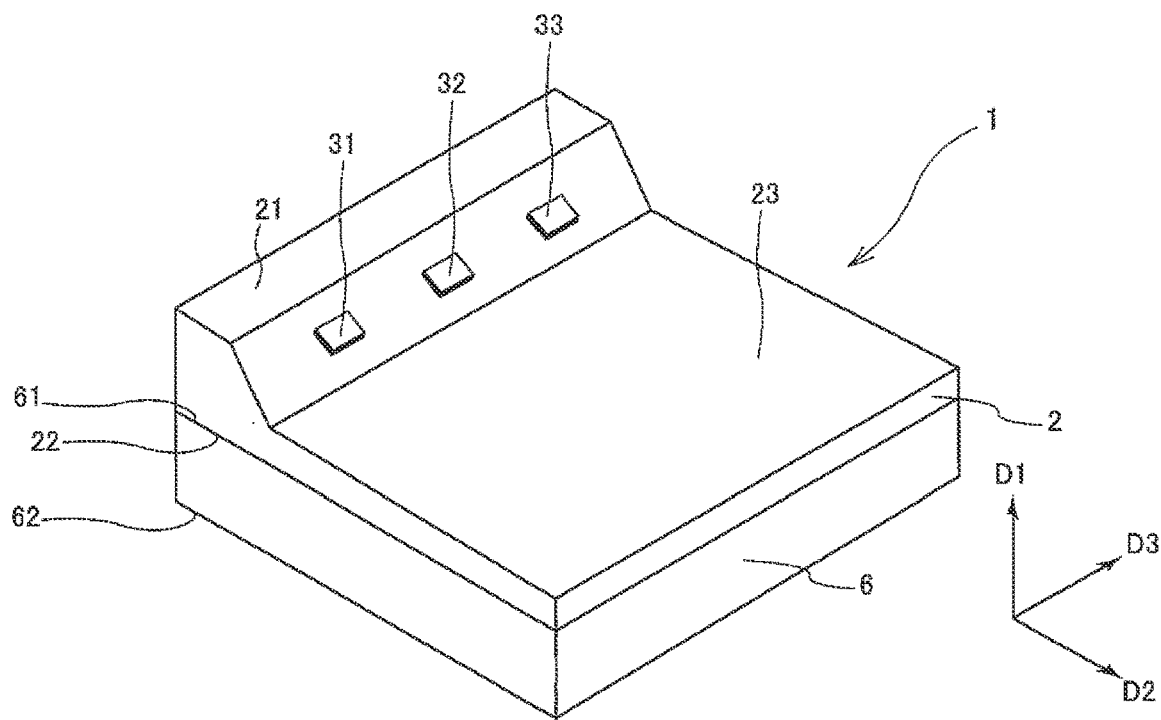
FIG. 1D is a perspective view showing the schematic configuration of another aspect of the magnetic sensor according to an embodiment of the present invention.
Figure 1E:
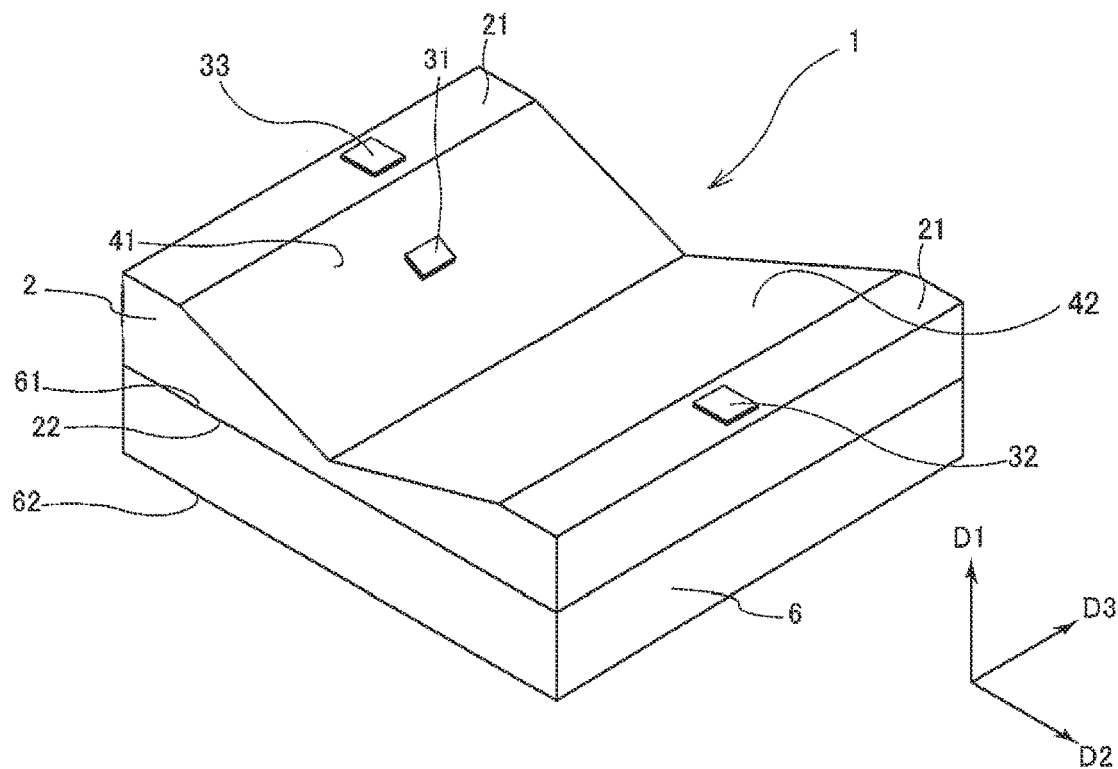
FIG. 1E is a perspective view showing the schematic configuration of another aspect of the magnetic sensor according to an embodiment of the present invention.
Figure 1F:
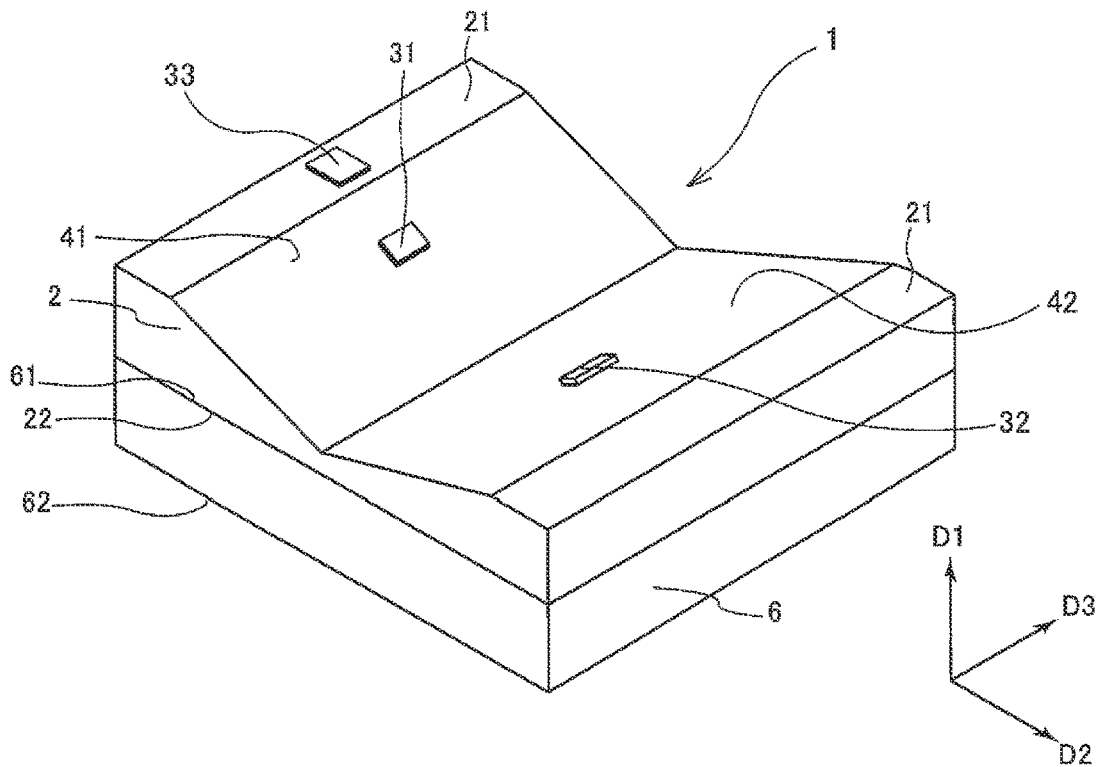
FIG. 1F is a perspective view showing the schematic configuration of another aspect of the magnetic sensor according to an embodiment of the present invention.
Figure 1G:
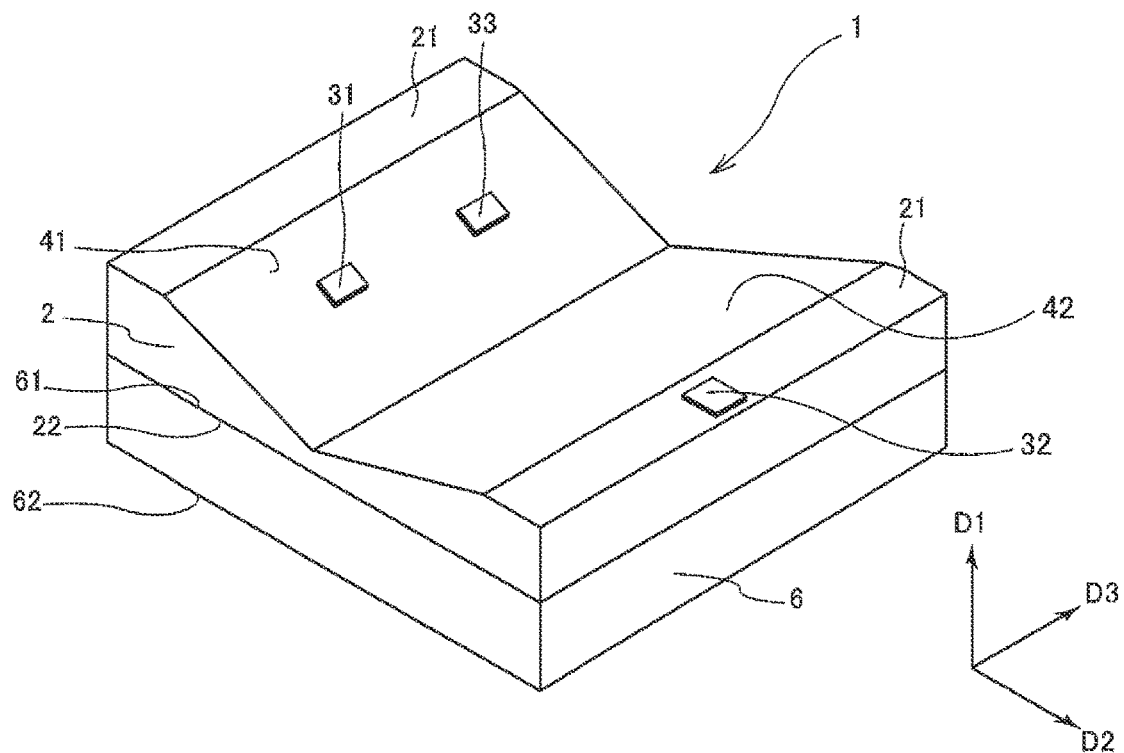
FIG. 1G is a perspective view showing the schematic configuration of another aspect of the magnetic sensor according to an embodiment of the present invention.
Figure 3A:
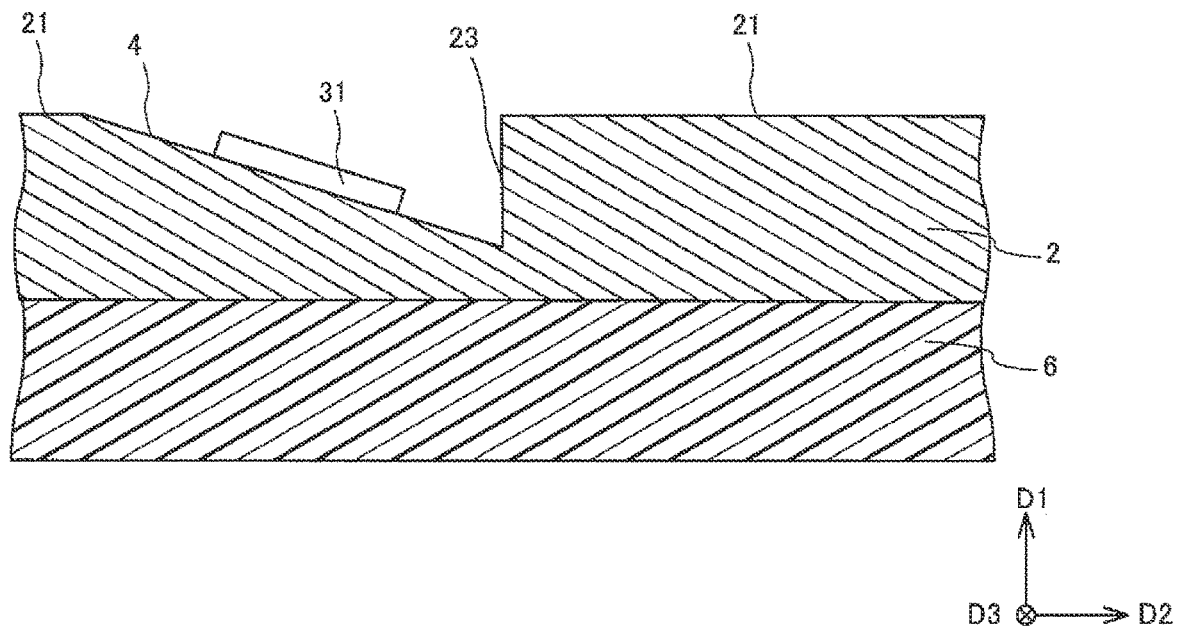
FIG. 3A is a partial, enlarged cross-sectional end view showing the schematic configuration of another aspect of the magnetic sensor according to the embodiment of the present invention, when viewed along the third direction.
Figure 3B:
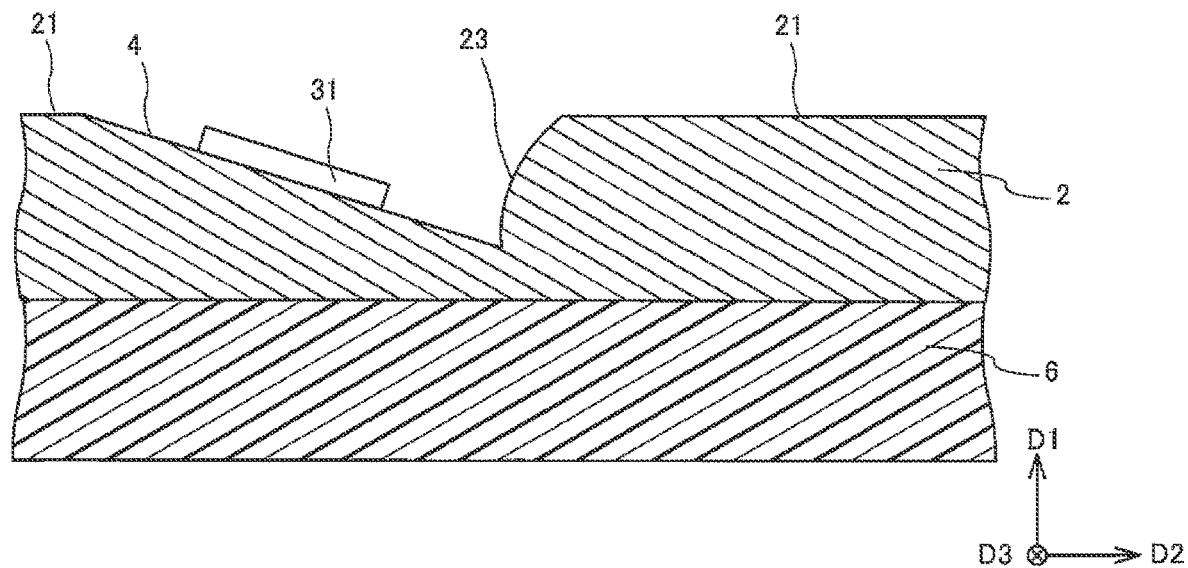
FIG. 3B is a partial, enlarged cross-sectional end view showing the schematic configuration of another aspect of the magnetic sensor according to the embodiment of the present invention, when viewed along the third direction.

As shown in FIG. 1A, one inclined surface 4 that is inclined at a predetermined angle is formed on a first surface 21 of the resin layer 2. A first magnetoresistive effect unit 31 is provided on the inclined surface 4. Since the first magnetoresistive effect unit 31 is provided on the inclined surface 4, the magnetic field in the first direction D1 can be detected with high accuracy. In an aspect in which one inclined surface 4 is formed on the first surface 21 of the resin layer 2, the angle and shape of another surface 23 formed on the first surface 21 of the resin layer 2 other than a first inclined surface 41 are not particularly limited. For example, the other surface 23 may be a parallel surface formed parallel to the first surface 21 of the resin layer 2 (see FIG. 2), may be a perpendicular surface formed perpendicular to the first surface 21 of the resin layer 2 (see FIG. 3A) or may be a curved surface formed with a curve (see FIG. 3B). In this case, the first magnetoresistive effect unit 31 is provided on one inclined surface 4. In this embodiment, if the inclined surface 4 is provided on the first magnetoresistive effect unit 31, the present embodiment is not limited to this aspect. For example, when a second magnetoresistive effect unit 32 for detecting a magnetic field in the second direction and a third magnetoresistive effect unit 33 for detecting a magnetic field in the third direction are further included, the second magnetoresistive effect unit 32 and the third magnetoresistive effect unit 33 may be provided (see FIG. 1B) on the first surface 21 of the resin layer 2 or the aforementioned parallel surface (see FIG. 2), and the first magnetoresistive effect unit 31 and either one of the second magnetoresistive effect unit 32 and the third magnetoresistive effect unit 33 may be provided on the inclined surface 4, and the other may be provided (see FIG. 1C) on the first surface 21 of the resin layer 2 or the aforementioned parallel surface (see FIG. 2). Alternatively, the inclined surface 4 may be provided with the first magnetoresistive effect unit 31, the second magnetoresistive effect unit 32, and the third magnetoresistive effect unit 33 (see FIG. 1D), Further, when the first inclined surface 41 and the second inclined surface 42 are formed as two inclined surfaces on the first surface 21 of the resin layer 2, the first magnetoresistive effect unit 31 may be provided on the first inclined surface 41 and the second magnetoresistive effect unit 32 and the third magnetoresistive effect unit 33 may be provided (see FIG. 1E) on the first surface 21 of the resin layer 2 or the aforementioned parallel surface (see FIG. 2), or the first magnetoresistive effect unit 31 and the second magnetoresistive effect unit 32 may be provided on the first inclined surface 41 and/or the second inclined surface 42, and the third magnetoresistive effect unit 33 may be provided (see FIG. 1F and FIG. 1G) on the first surface 21 of the resin layer 2 or the aforementioned parallel surface (see FIG. 2). Further, even in an aspect in which the first through third inclined surfaces 41~43 are formed as three inclined surfaces on the first surface 21 of the resin layer 2 (see FIG. 11, FIG. 12 and so forth), other than those inclined surfaces, the other surface 23 such as the aforementioned perpendicular surface, parallel surface, curved surface, or the like may be formed on the first surface 21 of the resin layer 2.

Figure 11:
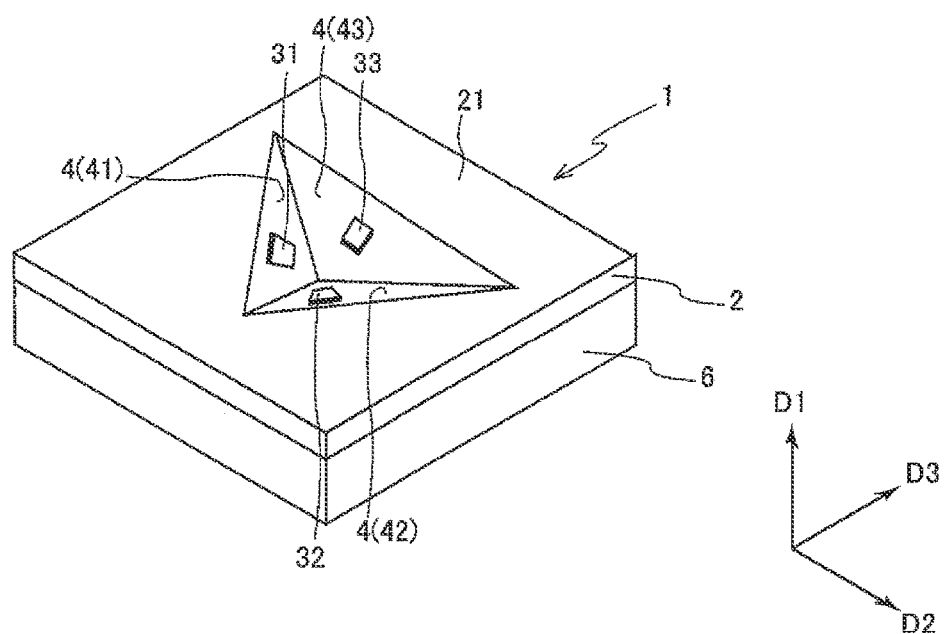
FIG. 11 is a perspective view showing the schematic configuration of another aspect of the magnetic sensor according to the embodiment of the present invention.
Figure 12:
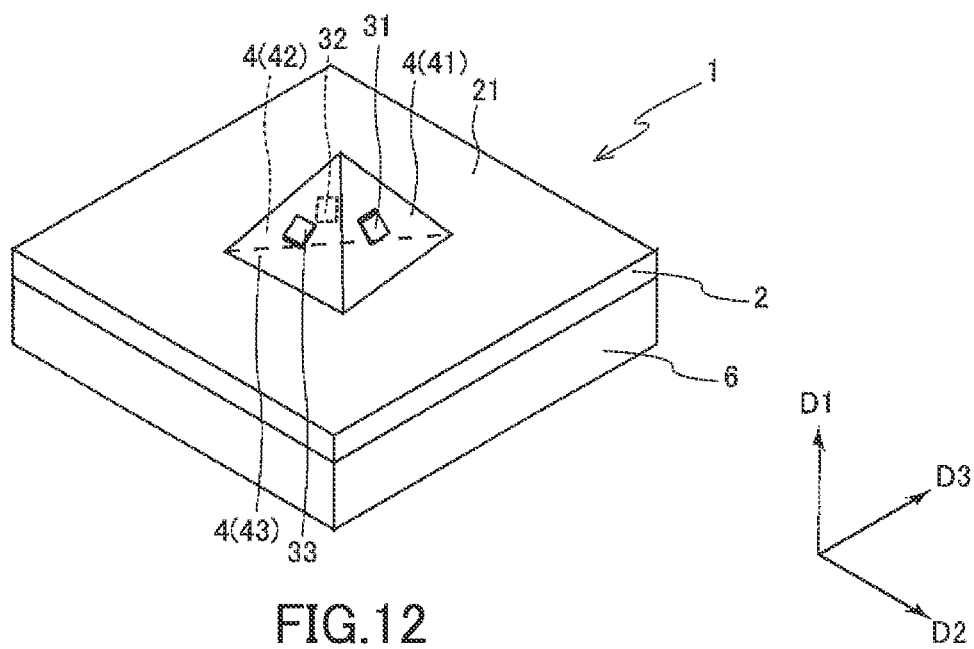
FIG. 12 is a perspective view showing the schematic configuration of another aspect of the magnetic sensor according to the embodiment of the present invention.

The inclined surface 4 includes the first inclined surface 41, the second inclined surface 42, and the third inclined surface 43 having mutually different inclination directions, and the first inclined surface 41 may be provided with the first magnetoresistive effect unit 31, the second inclined surface 42 may be provided with the second magnetoresistive effect unit 32, and the third inclined surface 43 may be provided with the third magnetoresistive effect unit 33 (see FIG. 11). By providing the first through third magnetoresistive effect units 31~33 on the first through third inclined surfaces 41~43, respectively, the magnetic fields in the first through third directions D1~D3 can be detected with high accuracy. Further, as shown in FIG. 11, the first through third inclined surfaces 41~43 are inclined from the first surface 21 toward the second surface 22 of the resin layer 2, but this is intended to be illustrative and not limiting, for the first through third inclined surfaces 41~43 may be inclined in a direction of protruding from the first surface 21 of the resin layer 2 (see FIG. 12), In the present embodiment, a case in which the inclined surface 4 including the first through third inclined surfaces 41~43 is formed on the first surface 21 of the resin layer 2 was cited as an example, but this is intended to be illustrative and not limiting, for the inclined surface 4 may be such that n (where n is an integer that is 1 or greater) inclined surfaces such as those including the two inclined surfaces, namely the first inclined surface 41 and the second inclined surface 42, are formed.

The inclination angle θ of the inclined surface 4 (the inclination angle θ1 of the first inclined surface 41, the inclination angle 82 of the second inclined surface 42, and the inclination angle θ3 of the third inclined surface 43) may be in the range of 10~55° with respect of the first surface 21 of the resin layer 2, and preferably in the range of 20~40°. When a plurality of inclined surfaces (for example, the first through third inclined surfaces 41~43) is formed on the resin layer 2, the inclination angles θ (inclination angles θ1 to θ3) of each inclined surface (first through third inclined surfaces) may be the same as each other, or may be different from each other, as long as such are within the above-described numerical range.

As shown in FIG. 11, when the inclined surfaces 41~43 are viewed from directions orthogonal to the first through third inclined surfaces 41~43, respectively, the shapes of the inclined surfaces 41~43 are substantially triangular, but this is intended to be illustrative and not limiting, for the shapes may be substantially square or the like.

As shown in FIG. 11, one side of the outer periphery of the first inclined surface 41 and one side of the outer periphery of the second inclined surface 42 are shared, one side of the outer periphery of the third inclined surface 43 and one side of the outer periphery of the first inclined surface 41 are shared, and one side of the outer periphery of the third inclined surface 43 and one side of the outer periphery of the second inclined surface 42 are shared. That is, the first inclined surface 41, the second inclined surface 42, and the third inclined surface 43 are surfaces of the triangular pyramid-shaped recess formed in the first surface 21 of the resin layer 2. In the present embodiment, this is intended to be illustrative and not limiting, for one side of the outer periphery of two arbitrarily selected inclined surfaces out of the first through third inclined surfaces 41~43 (for example, the first inclined surface 41 and the second inclined surface 42) may be shared, and the other inclined surface (for example, the third inclined surface 43) may be formed on the first surface 21 of the resin layer 2 without the outer periphery being shared with the two inclined surfaces, or the first through third inclined surfaces 41~43 may each be formed on the first surface 21 of the resin layer 2 without sharing outer periphery with either of the other inclined surfaces.

Figure 4:
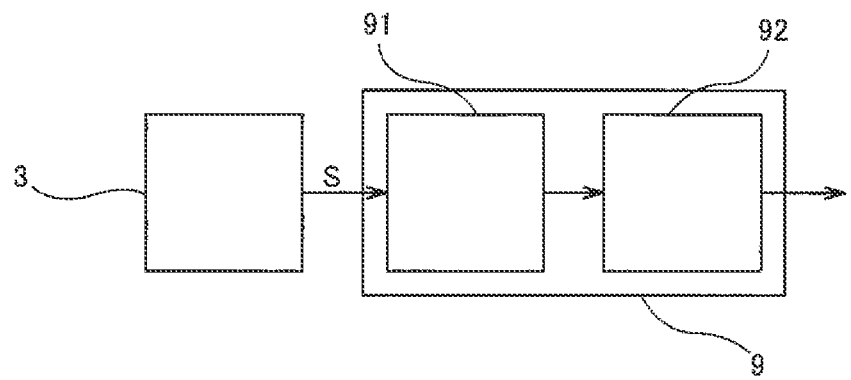
FIG. 4 is a block diagram showing the schematic configuration of the magnetic sensor according to the embodiment of the present invention.

FIG. 4 is a block diagram showing the schematic configuration of the magnetic sensor according to the present embodiment. As shown in FIG. 4, the magnetic sensor 1 (see FIG. 1A) according to the present embodiment comprises the magnetoresistive effect unit 3 and a signal processing unit 9. The signal processing unit 9 includes an ND (analog-digital) conversion unit 91 that converts an analog signal output from the magnetoresistive effect unit 3 into a digital signal, and a calculation unit 92 that performs calculation processing on the digital signal converted to digital by the A/D conversion unit 91.

Figure 5:
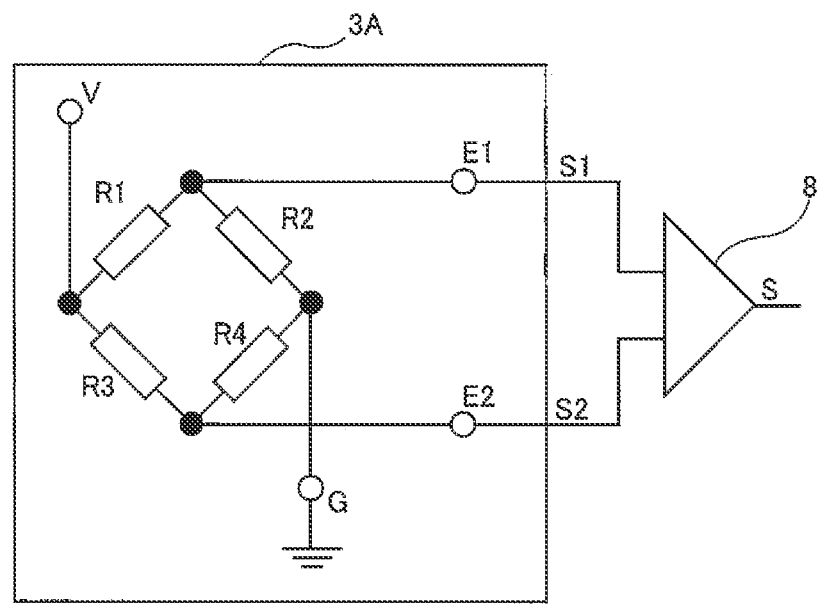
FIG. 5 is a circuit diagram showing the schematic configuration of one aspect of the circuit configuration of the magnetic sensor according to the embodiment of the present invention.
Figure 6:
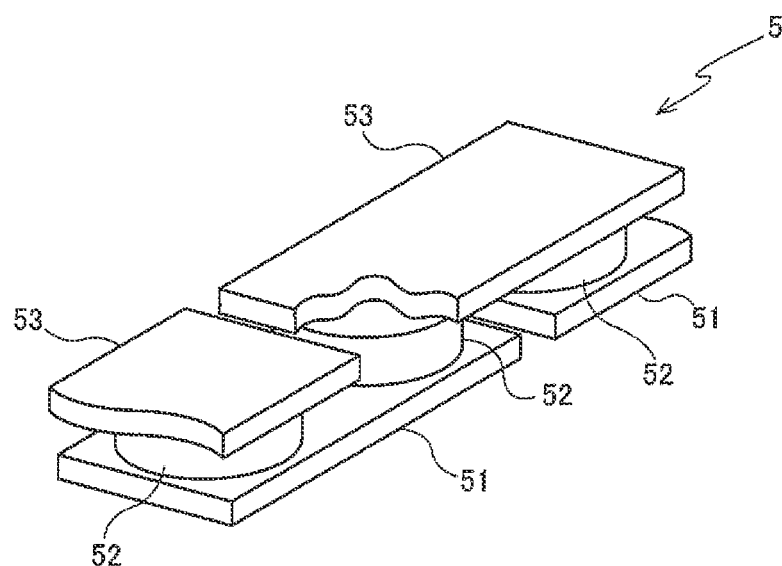
FIG. 6 is a perspective view showing the schematic configuration of a magnetoresistive effect element according to the embodiment of the present invention.
Figure 7:
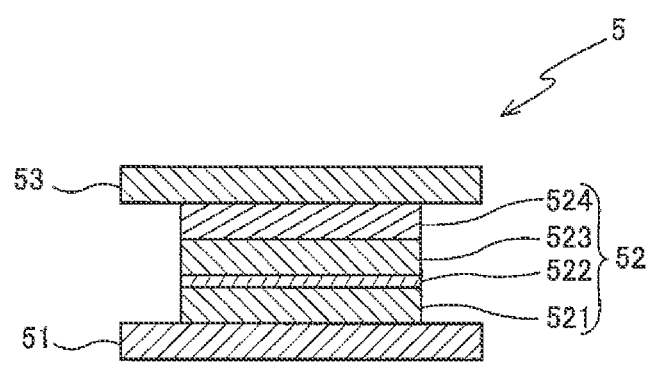
FIG. 7 is a cross-sectional view showing the schematic configuration of a magnetoresistive effect element in the embodiment of the present invention.

FIG. 5 is a circuit diagram showing the schematic configuration of one aspect of the circuit configuration of the magnetic sensor according to the present embodiment, FIG. 6 is a perspective view showing the schematic configuration of the magnetoresistive effect element according to the present embodiment, and FIG. 7 is a cross-sectional view showing the schematic configuration of the magnetoresistive effect element according to the present embodiment.

The magnetoresistive effect unit 3 may include a magnetoresistive effect element 5. In the present embodiment, the circuit configuration of the magnetoresistive effect unit 3 should be a Wheatstone bridge circuit 3A in which four resistors, namely a first resistor R1, a second resistor R2, a third resistor R3 and a fourth resistor R4 are bridge-connected. The first through fourth resistors R1~R4 may include a single magnetoresistive effect element or may include a plurality of magnetoresistive effect elements.

As shown in FIG. 5, the Wheatstone bridge circuit 3A included in the magnetoresistive effect unit 3 includes a power supply port V, a ground port G, two output ports E1 and E2, the first and second resistors R1 and R2 connected in series, and the third and fourth resistors R3 and R4 connected in series. One end each of the first and third resistors R1 and R3 is connected to the power supply port V. The other end of the first resistor R1 is connected to one end of the second resistor R2 and the output port E1 The other end of the third resistor R3 is connected to one end of the fourth resistor R4 and the output port E2. The other ends of the second and fourth resistor R2 and R4 are connected to the ground port G. A power supply voltage of a predetermined magnitude is applied to the power supply port V, and the ground port G is connected to ground.

In the present embodiment, the first to fourth resistors R1~R4 included in the Wheatstone bridge circuit 3A may be composed of MR elements such as AMR elements, GMR elements, or TMR elements or the like, or may be composed of Hall elements. GMR elements and TMR elements include a magnetization fixed layer in which the magnetization direction is fixed, a free layer in which the magnetization direction changes in accordance with the direction of an impressed magnetic field, and a nonmagnetic layer arranged between the magnetization fixed layer and the free layer. AMR elements include a magnetic layer having shape anisotropy.

As shown in FIG. 6 and FIG. 7, MR elements such as GMR elements or TMR elements constituting the first through fourth resistors R1~R4 should include a plurality of lower electrodes 51, a plurality of MR films 52 and a plurality of upper electrodes 53. The plurality of lower electrodes 51 is provided on a substrate (undepicted), Each lower electrode 51 has a long, slender shape. A gap is formed between two lower electrodes 51 adjacent to each other in the lengthwise direction of the lower electrodes 51. The MR films 52 are provided on the upper surface of the lower electrodes 51 near both ends in the lengthwise direction. The MR films 52 each have a substantially circular shape in a plan view, and include a free layer 521, a nonmagnetic layer 522, a magnetization fixed layer 523 and an antiferromagnetic layer 524, which are layered in this order from the lower electrode 51 side. The free layer 521 is electrically connected to the lower electrode 51. The antiferromagnetic layer 524 is made of an antiferromagnetic material and plays the role of fixing the direction of magnetization of the magnetization fixed layer 523 by being exchange-coupled with the magnetization fixed layer 523. The plurality of upper electrodes 53 is provided on the plurality of MR films 52. Each upper electrode 53 has a long, slender shape and is arranged on two lower electrodes 51 adjacent to each other in the lengthwise direction of the lower electrodes 51, and electrically connects the antiferromagnetic layers 524 of the two adjacent MR films 52 to each other. The MR films 52 may have a laminated body in which the free layer 521, the nonmagnetic layer 522, the magnetization fixed layer 523 and the antiferromagnetic layer 524 are layered in this order from the upper electrode 53 side.

When the resin material of which the resin layer 2 is made is a thermoplastic resin, the antiferromagnetic material constituting the antiferromagnetic layer 524 is preferably a material whose Néel temperature is higher than the softening temperature of the thermoplastic resin. For example, when the thermoplastic resin constituting the resin layer 2 is a novolac resin (softening temperature: 170~180° C.), the antiferromagnetic materials constituting the antiferromagnetic layer 524 should include Mn and at least one element selected from the group of Pt, Ru, Rh, Pd, Ni, Cu, Ir, Cr, and Fe. The Mn content in the antiferromagnetic material may be, for example, about 35~95 atomic %.

In a TMR element, the nonmagnetic layer 522 is a tunnel barrier layer. In a GMR element, the nonmagnetic layer 522 is a nonmagnetic conductive layer. In TMR elements and GMR elements, the resistance value changes in accordance with the angle formed by the magnetization direction of the free layer 521 with respect to the magnetization direction of the magnetization fixed layer 523. The resistance value becomes a minimum when this angle is 0° (the magnetization directions are parallel to each other), and the resistance value becomes a maximum when this angle is 180° (the magnetization directions are antiparallel to each other).

The magnetization direction of the magnetization fixing layer 524 of the magnetoresistive effect element 5 included in the first magnetoresistive effect unit 31 is fixed in a direction parallel to the inclined surface 4.

Figure 8:
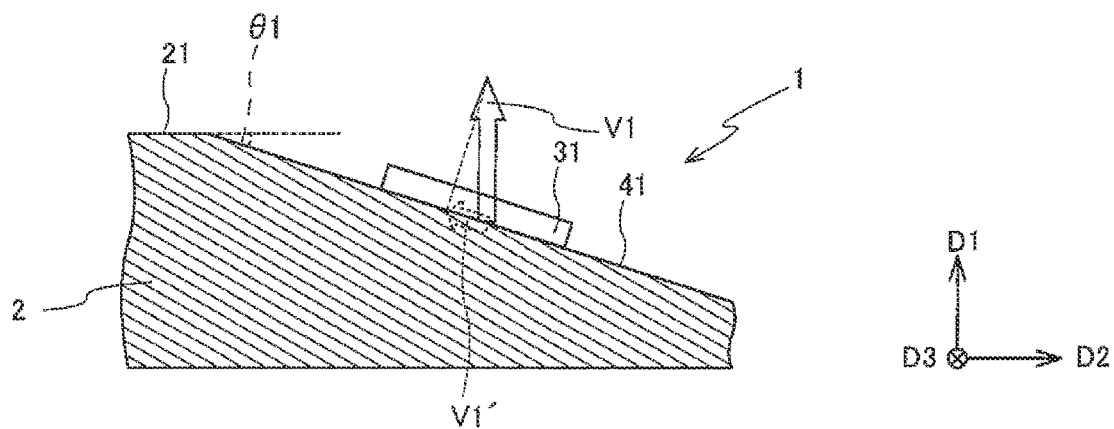
FIG. 8 is a partial, enlarged cross-sectional end view explaining detection of a magnetic field in a first direction by the first magnetoresistive effect unit in the embodiment of the present invention.

FIG. 8 is a partially enlarged cutaway end view for explaining detection of the magnetic field in the first direction by the first magnetoresistive effect unit in the embodiment of the present invention. As shown in FIG. 8, the magnetoresistive effect element 5 of the first magnetoresistive effect unit 31 that detects the magnetic field in the first direction D1 indicates the change in resistance value in accordance with the projected vector V1', which is the magnetic vector V1 indicating the magnetic field in the first direction D1 projected onto the first inclined surface 41.

The potential difference between the output ports E1 and E2 changes accompanying changes in the resistance values of the first through fourth resistors R1~R4 in accordance with the projected vector V1" in the first direction D1 (see FIG. 8), and a signal is output as the change in potential difference. A difference detector 8 amplifies signals S1 and S2 corresponding to the potential difference between the output ports E1 and E2, and outputs a sensor signal S to the A/D conversion unit 91 of the signal processing unit 9.

The A/D conversion unit 91 converts the sensor signal S (analog signal related to the detected magnetic field) output from the magnetoresistive effect unit 3 into a digital signal, and this digital signal is input into the calculation unit 92. The calculation unit 92 performs calculation processing on the digital signal converted from the analog signal by the A/D conversion unit 91. The calculation unit 92 comprises, for example, a microcomputer, an ASIC (Application Specific Integrated Circuit), or the like. As described above, the first magnetoresistive effect unit 31 outputs the sensor signal S corresponding to the projected vector V1', which is the magnetic vector V1 projected onto the inclined surface 4. However, since the magnetic field to be detected by the magnetic sensor 1 is the magnetic field in the first direction D1, if the calculation unit 92 does not perform calculation processing using the sensor signal that should be output in accordance with the magnetic vector V1, an error will occur in the detection results from the magnetic sensor 1. In the present embodiment, the calculation unit 92 performs calculation processing after converting the sensor signal S (digital signal converted by the A/D conversion unit 91) corresponding to the projected vector V1' into a sensor signal to be output in accordance with the magnetic vector V1. As a result, the detection accuracy of the magnetic sensor 1 can be improved.

Figure 16:
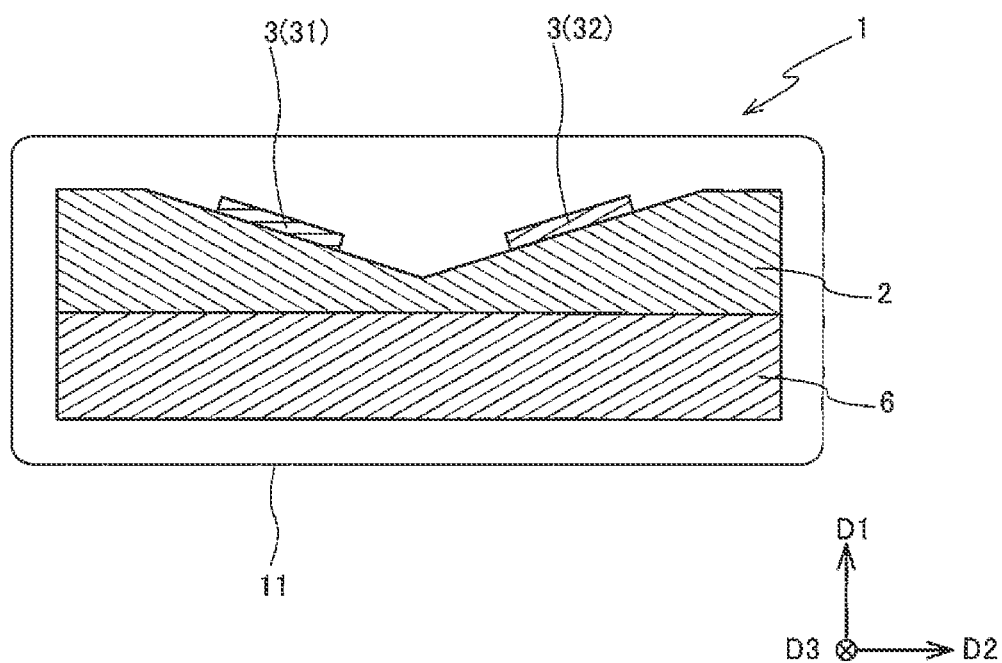
FIG. 16 is a cut end view showing a schematic configuration when another aspect of the magnetic sensor according to one embodiment of the present invention is viewed along the third direction.

The magnetic sensor 1 according to the present embodiment may further include a sealing unit 11 (see FIG. 16) that integrally seals the substrate 6, the resin layer 2 and the magnetoresistive effect unit 3. The sealing unit 11 of the magnetic sensor 1 should be one that can integrally seal and protect the substrate 6, the resin layer 2 and the magnetoresistive effect unit 3, and for example, may be made of resin, resin combined with glass fibers, or the like.

Figure 9A:
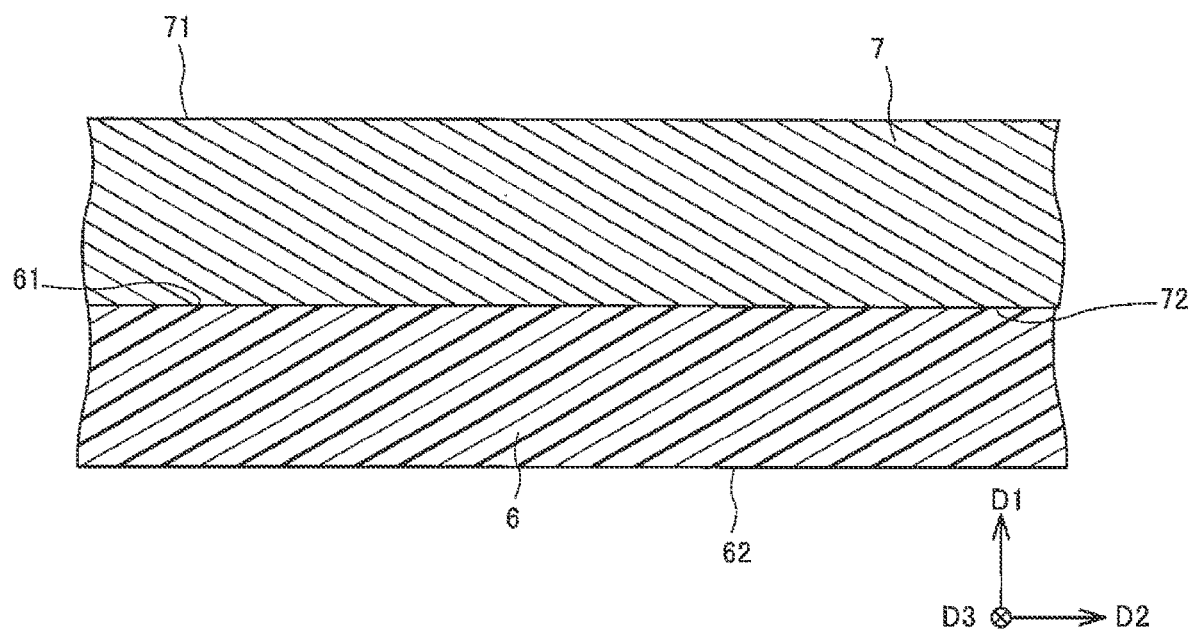
FIG. 9A is a partial, enlarged cross-sectional end view schematically showing one step in the magnetic sensor manufacturing method of the embodiment of the present invention.
Figure 9B:
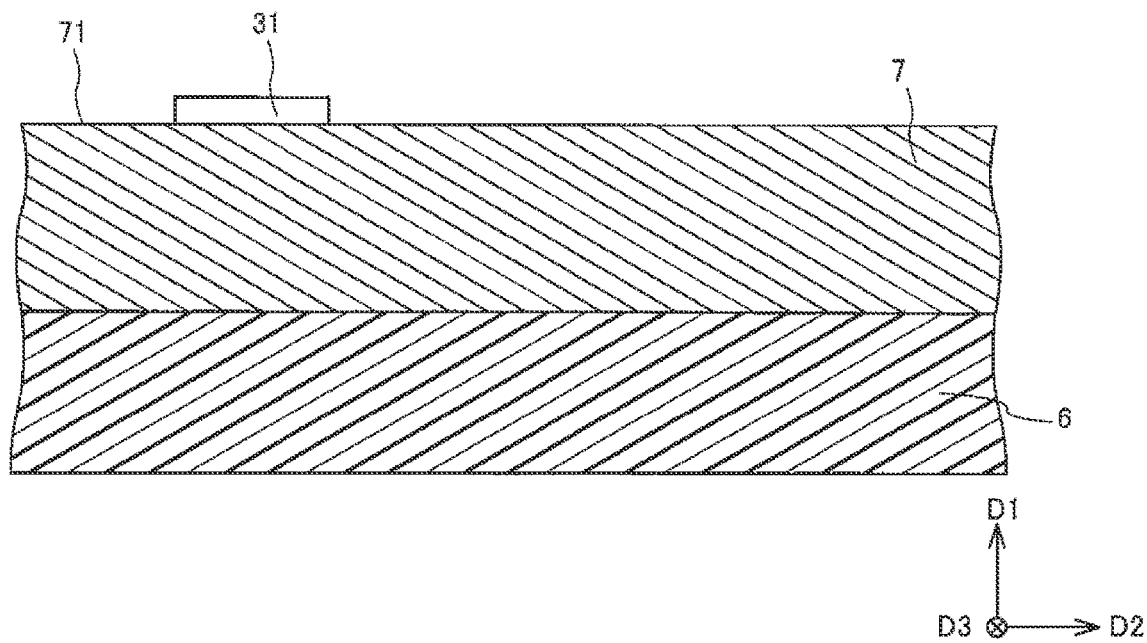
FIG. 9B is a partial, enlarged cross-sectional end view schematically showing one step, namely the step following the step shown in FIG. 9A, in the magnetic sensor manufacturing method of the embodiment of the present invention.
Figure 9C:
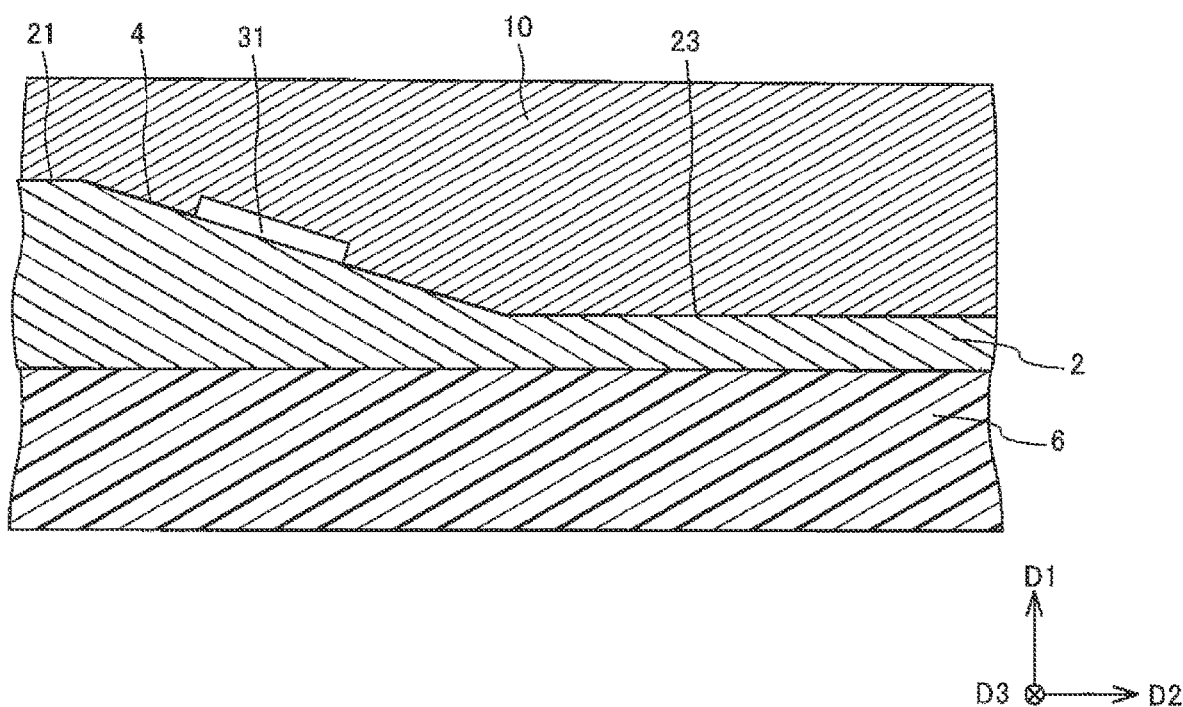
FIG. 9C is a partial, enlarged cross-sectional end view schematically showing one step, namely the step following the step shown in FIG. 93, in the magnetic sensor manufacturing method of the embodiment of the present invention.
Figure 10:
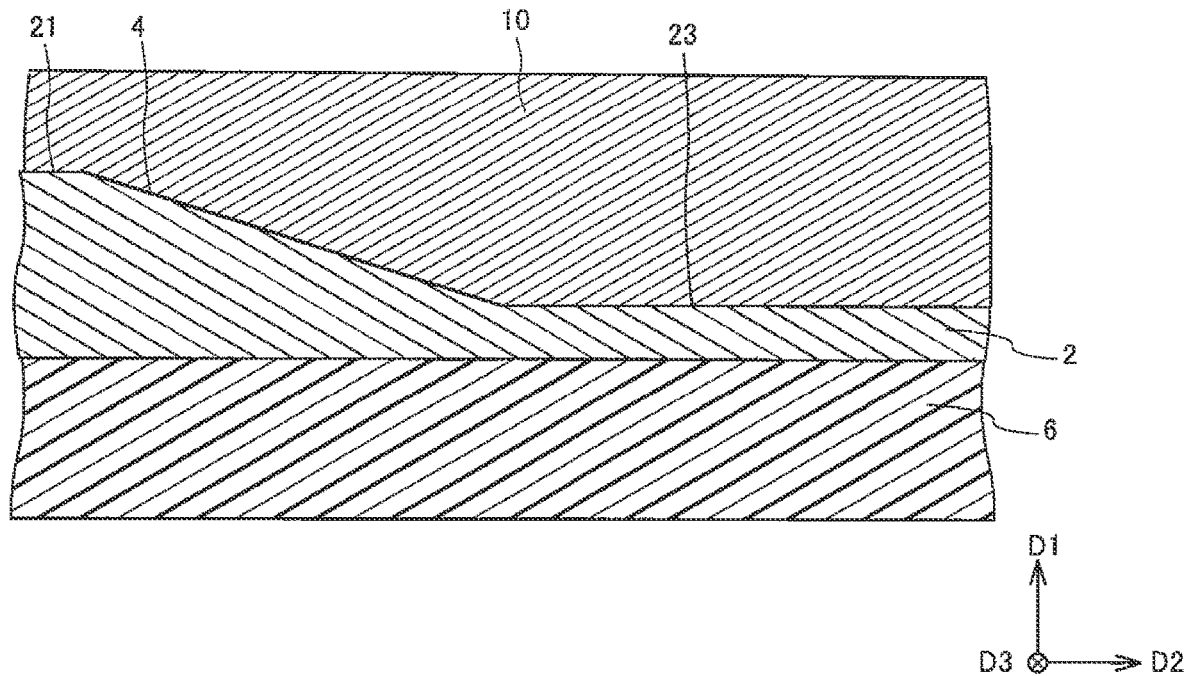
FIG. 10 is a partial, enlarged cross-sectional end view schematically showing one step, namely the step following the step shown in FIG. 9A, of another aspect of the magnetic sensor manufacturing method of the embodiment of the present invention.

A method of manufacturing the magnetic sensor 1 described above will be described. FIGS. 9A~9C are partially enlarged cutaway end views schematically showing the magnetic sensor manufacturing method in the present embodiment.

The method for manufacturing the magnetic sensor 1 according to the present embodiment includes: a step for forming the resin material layer 7 having a first surface 71 and a second surface 72, which is opposite to the first surface 71 on the first surface 61 of the substrate 6 (see FIG. 9A), a step for providing the first magnetoresistive effect unit 31 on the first surface 71 of the resin material layer 7 (see FIG. 9B), and a step for forming the inclined surface 4 inclined at a predetermined angle with respect to the first surface 71, on the first surface 71 of the resin material layer 7 (see FIG. 9C).

As shown in FIG. 9A, the resin material layer 7 is formed on the first surface 61 of the substrate 6 by preparing the substrate 6 and supplying a thermoplastic resin such as a novolac resin or polyimide onto the first surface 61 of the substrate 6. Examples of the substrate 6 include a semiconductor substrate such as a silicon substrate or the like, a glass substrate such as a quartz glass substrate or the like, and a resin substrate such as a polyethylene terephthalate substrate or the like. As a method of supplying the resin material on the first surface 61 of the substrate 6, a conventionally known method may be adopted, for example a method of attaching a film made of a thermoplastic resin to the first surface 61 of the substrate 6 or the like. The thermoplastic resin is preferably one having a softening temperature lower than the Néel temperature of the antiferromagnetic material comprising the antiferromagnetic layer 524 of the magnetoresistive effect elements 5 included in the first through third magnetoresistive effect units 31~33 described later. The softening temperature of the thermoplastic resin is preferably 30° C. or more, and more preferably 50° C. or more, lower than the Néel temperature of the antiferromagnetic material. In the below-described step for forming the inclined surface 4 (see FIG. 9C), the resin material layer 7 made of the thermoplastic resin is heated and softened, but at the same time, the first magnetoresistive effect unit 31 is also heated. If the softening temperature of the thermoplastic resin is lower than the Néel temperature of the antiferromagnetic material of which the antiferromagnetic layer 524 is made, by heating the resin material layer 7 to at least the softening temperature but less than the Néel temperature, it is theoretically possible to soften the resin material layer 7 without causing the antiferromagnetic material of which the antiferromagnetic layer 524 is made to become paramagnetic. The step for forming the inclined surface 4 (see FIG. 9C) is performed using a thermal imprinting apparatus or the like, but if the temperature difference between the softening temperature and the Néel temperature is relatively small, there are cases in which severe control is necessary in heating the resin material layer 7 to at least the softening temperature and below the Néel temperature in the thermal imprinting apparatus. Therefore, depending on the thermal imprinting apparatus used in the above-described step, when the temperature difference is small, there is a concern that the Néel temperature of the antiferromagnetic material constituting the antiferromagnetic layer 524 may be exceeded, and the manufacturing yield of the magnetic sensor 1 could be lowered. Since the softening temperature of the thermoplastic resin is at least 30° C. lower than the Néel temperature of the antiferromagnetic material, the heating temperature in the thermal imprinting apparatus can be easily and surely controlled, and therefore the manufacturing yield of the magnetic sensor 1 can be improved.

As shown in FIG. 9B, a first magnetoresistive effect unit 31 for detecting a magnetic field in the first direction D1 is provided in a predetermined region on the first surface 71 of the resin material layer 7. In a step described below (see FIG. 9C), by pressing the template 10 against the first surface 71 of the resin material layer 7, the inclined surface 4 is formed on the first surface 71 of the resin material layer 7. When the template 10 is pressed against the first surface 71 of the resin material layer 7, the first magnetoresistive effect unit 31 is also pressed at the same time. Consequently, the first magnetoresistive effect unit 31 should be appropriately provided at a position (position on the first surface 71 of the resin material layer 7) that can be provided on the inclined surface 4 formed using the template 10. In the present embodiment, the first magnetoresistive effect unit 31 is provided on the first surface 71 of the resin material layer 7, but this is intended to be illustrative and not limiting. For example, the first magnetoresistive effect unit 31 and the second magnetoresistive effect unit 32 for detecting magnetic fields in the second direction D2 and/or the third magnetoresistive effect unit 33 for detecting magnetic fields in the third direction D3 may be provided on the first surface 71 of the resin material layer 7.

The first magnetoresistive effect unit 31 may include a magnetoresistive effect element 5 having at least the antiferromagnetic layer 524 made of an antiferromagnetic material. The antiferromagnetic material of which the antiferromagnetic layer 524 is made may have a Néel temperature higher than the softening temperature of the thermoplastic resin of which the resin material layer 7 is made, and should include, for example, Mn and at least one element selected from the group consisting of Pt, Ru, Rh, Pd, Ni, Cu, Ir, Cr, and Fe, and the Mn content in the antiferromagnetic material should be, for example, 35 to 95 atom ic %. In the below-described step, the inclined surface 4 is formed by pressing the template 10 against the resin material layer 7 and the first magnetoresistive effect unit 31 in a state where the resin material layer 7 is heated and softened (see FIG. 9C), and if the Néel temperature of the antiferromagnetic material is not greater than the softening temperature of the thermoplastic resin, there is a concern that the antiferromagnetic material will become paramagnetic and the magnetization direction of the magnetization fixed layer 523 will not be fixed by the antiferromagnetic layer 524.

Subsequently, the resin material layer 7 is heated under temperature conditions at least as great as the softening temperature of the thermoplastic resin of which the resin material layer 7 is made and lower than the Néel temperature of the antiferromagnetic material of which the antiferromagnetic layer 524 is made, and the template 10 having an uneven structure including a predetermined inclined surface is pressed against the first surface 71 of the resin material layer 7 and the first magnetoresistive effect unit 31. Then, the resin material layer 7 is cured while the template 10 is pressed against this layer to form the inclined surface 4 (see FIG. 9C). The inclined surface of the uneven structure of the template 10 corresponds to the inclined surface 4 of the magnetic sensor 1 according to the present embodiment. Therefore, after the resin material layer 7 is cured, the template 10 is separated from the resin material layer 7 to manufacture the magnetic sensor 1 having an inclined surface 4 and having the first magnetoresistive effect unit 31 on the inclined surface 4 (see FIG. 1A).

In the present embodiment, the softening temperature of the thermoplastic resin of which the resin material layer 7 is made is lower than the Néel temperature of the antiferromagnetic material of which the antiferromagnetic layer 524 is made, and by heating to a temperature at least as great as the softening temperature of the thermoplastic resin, the thermoplastic resin is softened. At this time, the first magnetoresistive effect unit 31 is also heated, but since heating is to a temperature lower than the Néel temperature of the antiferromagnetic material of which the antiferromagnetic layer 524 is made, it is possible to prevent the antiferromagnetic material of the antiferromagnetic layer 524 from becoming paramagnetic.

Furthermore, by pressing the template 10 against the softened resin material layer 7, the inclined surface 4 can be easily formed, and the first magnetoresistive effect unit 31 can be provided on each of the inclined surfaces 4. Since the first surface 71 of the resin material layer 7 on which the first magnetoresistive effect unit 31 is provided is a surface having a predetermined flatness, the first magnetoresistive effect unit 31 can be manufactured with high accuracy with a commonly known film forming method (for example, a sputtering method or the like), Furthermore, since the first magnetoresistive effect unit 31 is also pressed against the template 10 together with the resin material layer 7, the first magnetoresistive effect unit 31 manufactured with high accuracy can be provided on the inclined surface 4 of the resin layer 2. Therefore, with the magnetic sensor 1 manufactured by the present embodiment, the magnetic field in the first direction D1 can be detected with high accuracy.

The embodiment described above was described to facilitate understanding of the present invention and was not described in order to limit the present invention. Therefore, each element disclosed in the above embodiment is intended to include all design changes and equivalents falling within the technical scope of the present invention.

In the above embodiment, an embodiment in which the inclined surface 4 is formed on the first surface 71 of the resin material layer 7 and the first magnetoresistive effect unit 31 is provided has been described as an example, but this is intended to be illustrative and not limiting. For example, the first through third inclined surfaces 41~43 having different inclination directions may be formed, the first magnetoresistive effect unit 31 may be provided on the first inclined surface 41, a second magnetoresistive effect unit 32 may be provided on the second inclined surface 42 and a third magnetoresistive effect unit 33 may be provided on the third inclined surface 43 (see FIG. 11, FIG. 12, and so forth), or the first inclined surface 41 and the second inclined surface 42 having different inclination directions may be formed, the first magnetoresistive effect unit 31 may be provided on the first inclined surface 41, the second magnetoresistive effect unit 32 may be provided on the second inclined surface 42, and the third magnetoresistive effect unit 33 may be provided on the first inclined surface 41 or the second inclined surface 42, or the first through third magnetoresistive effect units 31~33 may be provided on the first inclined surface 41 or the second inclined surface 42. Further, one inclined surface 4 may be formed, and the first through third magnetoresistive effect units 31~33 may be provided on the inclined surface 4 (see FIG. 1D).

Figure 13:
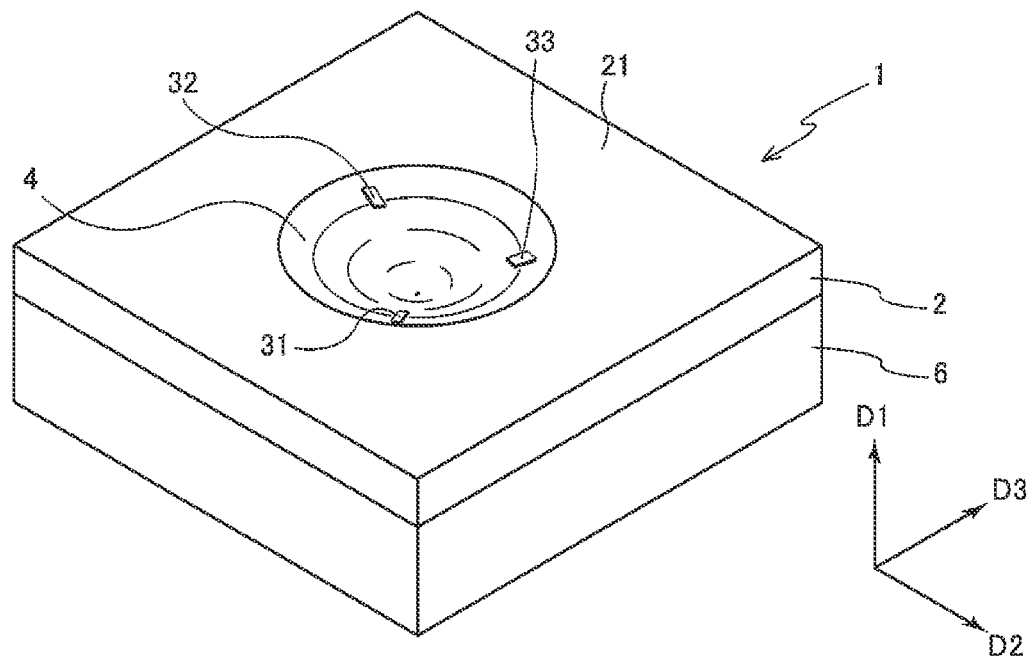
FIG. 13 is a perspective view showing the schematic configuration of another aspect of the magnetic sensor according to the embodiment of the present invention.
Figure 14:
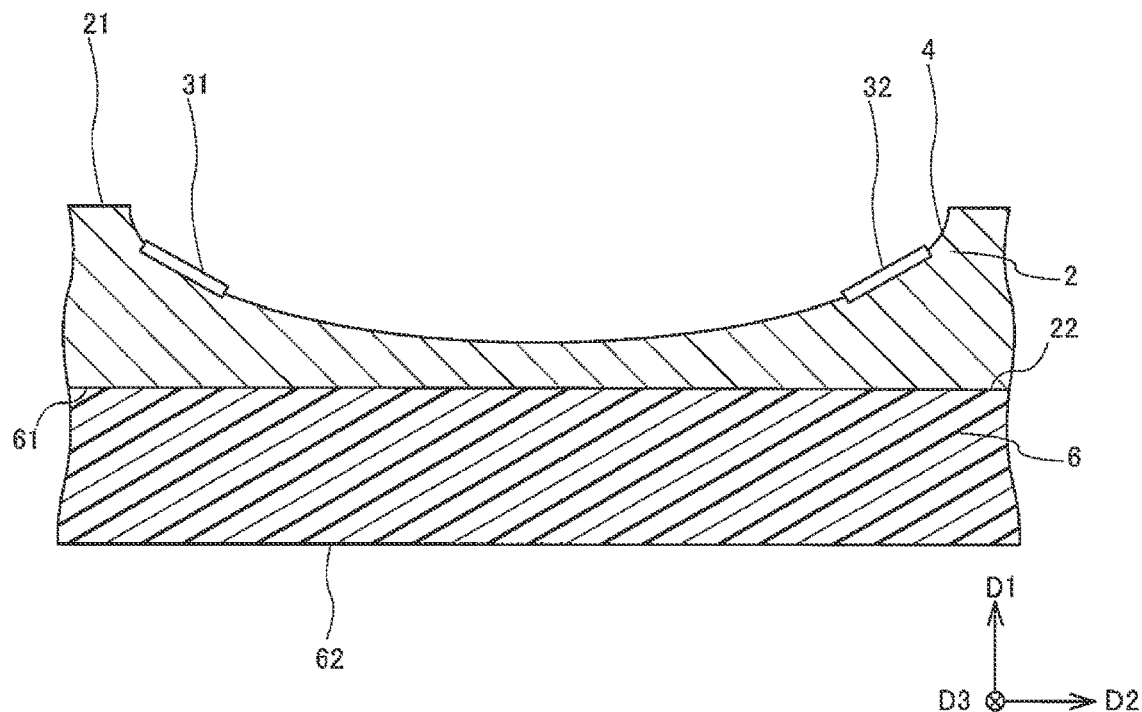
FIG. 14 is a partial, enlarged cross-sectional end view showing the schematic configuration of another aspect of the magnetic sensor according to the embodiment of the present invention.
Figure 15:
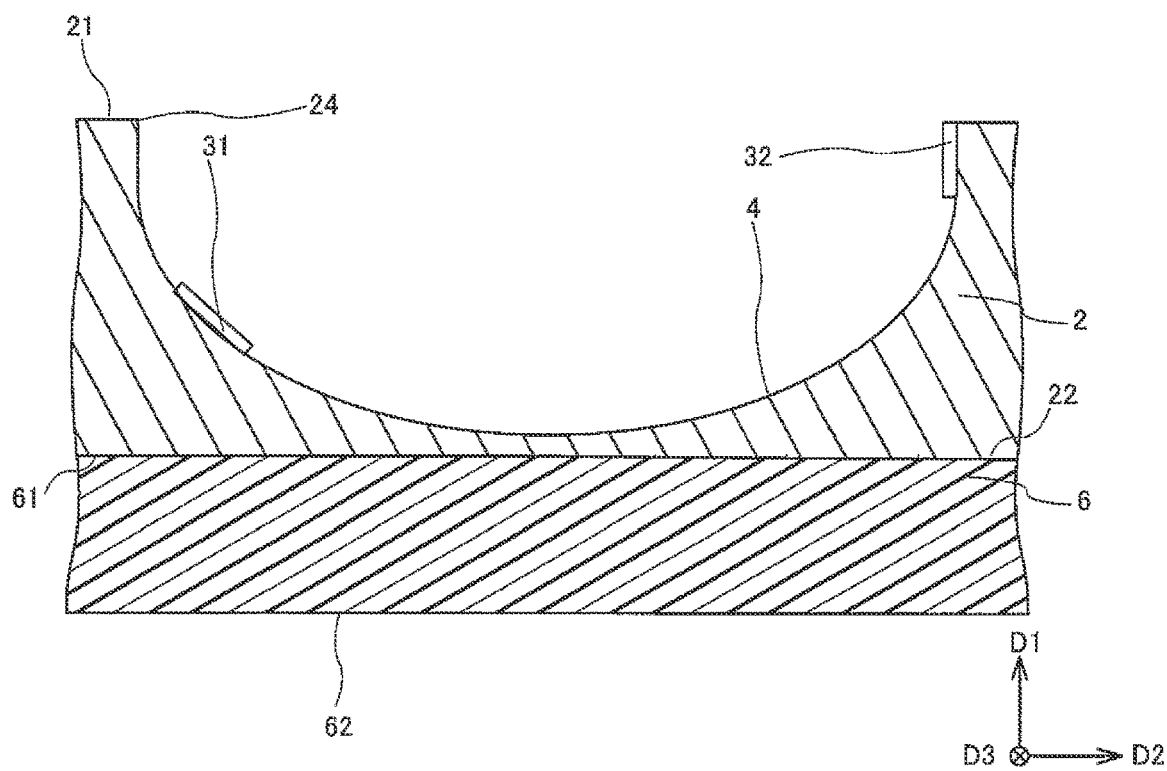
FIG. 15 is a partial, enlarged cross-sectional end view showing the schematic configuration of another aspect of the magnetic sensor according to the embodiment of the present invention.

In the above embodiment, an aspect in which the first through third inclined surfaces 41~43 having different inclination directions are formed in a triangular pyramid shape on the first surface 71 of the resin material layer 7 (see FIG. 11, FIG. 12 and so forth) was described as an example, but this is intended to be illustrative and not limiting. For example, by pressing the template 10 having a substantially conical uneven structure against the first surface 71 of the resin material layer 7 and the first through third magnetoresistive effect units 31~33, a conical inclined surface may be formed as the inclined surface 4 on the first surface 21 of the resin layer 2, and the first through third magnetoresistive effect units 31~33 may be provided on the conical inclined surface 4 (see FIG. 13). Further, by pressing the template 10 having a substantially hemispherical uneven structure against the first surface 71 of the resin material layer 7 and the first through third magnetoresistive effect units 31~33, a hemispherical surface may be formed as the inclined surface 4 on the first surface 21 of the resin layer 2, and the first through third magnetoresistive effect units 31~33 may be provided on the hemispherical surface (see FIG. 14). By providing the first through third magnetoresistive effect units 31~33 on the hemispherical surface, magnetic fields in various directions other than the first to third directions D1~D3 can be detected with high accuracy. Further, by pressing the template 10 having a substantially hemispherical uneven structure at the tip against the first surface 71 of the resin material layer 7 and the first through third magnetoresistive effect units 31~33, a hemispherical surface may be formed as the inclined surface 4 on the first surface 21 of the resin layer 2 and a perpendicular surface 24 continuous with the edge of the hemispherical surface may be formed, and the first through third magnetoresistive effect units 31~33 may be provided on the hemispherical surface and the perpendicular surface 24 (see FIG. 15). With the aspect shown in FIG. 15, the magnetoresistive effect unit (second magnetoresistive effect unit 32 in the illustrated example) provided on the perpendicular surface 24 can detect the magnetic field in the first direction D1 with high accuracy, and due to the magnetoresistive effect units (for example, the first magnetoresistive effect unit 31 and the third magnetoresistive effect unit 33) provided on the hemispherical surface, the magnetic field in an arbitrary direction in the plane including the second direction D2 and the third direction D3 can be detected with high accuracy.

In the above embodiment, an aspect in which the first magnetoresistive effect unit 31 for detecting the magnetic field in the first direction D1 is provided has been described as an example, but this is intended to be illustrative and not limiting. For example, this may be one in which the first magnetoresistive effect unit 31 that detects the magnetic field in the first direction D1 and the second magnetoresistive effect unit 32 and/or the third magnetoresistive effect unit 33 are provided.

In the above embodiment, the first magnetoresistive effect units 31~33 are provided on the first surface 71 of the resin material layer 7, and the template 10 is pressed against the resin material layer 7 and the first magnetoresistive effect units 31~33, but this is intended to be illustrative and not limiting. For example, after the resin material layer 7 is formed (see FIG. 9A), the template 10 may be pressed against the first surface 71 of the resin material layer 7 to form the inclined surface 4 (see FIG. 10), and the first magnetoresistive effect unit 31 may be provided on the inclined surface 4. In this case, because the first magnetoresistive effect unit 31 is provided on the inclined surface 4 formed in the resin material layer 7, it is not necessary to take into consideration the relationship between the softening temperature of the thermoplastic resin of which the resin material layer 7 is made and the Néel temperature of the antiferromagnetic materials of which the antiferromagnetic layer 524 is made. Further, as the resin material of which the resin material layer 7 is made, a thermosetting resin, an ultraviolet curable resin or the like can also be used. That is, the range of selection of the thermoplastic resin of which the resin material layer 7 is made can be broadened.

DESCRIPTION OF SYMBOLS

1 Magnetic sensor
2 Resin layer
21 First surface
22 Second surface
3 Magnetoresistive effect unit
31 First magnetoresistive effect unit
4 Inclined surface

The invention claimed is:
1. A magnetic sensor comprising:
a resin layer having a first surface and a second surface, which is opposite to the first surface; and
a magnetoresistive effect unit that detects a magnetic field in a predetermined direction;
wherein the magnetoresistive effect unit includes at least a first magnetoresistive effect unit that detects a magnetic field in a first direction;
the first direction is a direction orthogonal to the first surface of the resin layer;
an inclined surface that is inclined at a predetermined angle with respect to the first surface is formed in the first surface of the resin layer; and
the first magnetoresistive effect unit is formed in the inclined surface.

2. The magnetic sensor according to claim 1, wherein:
the magnetoresistive effect unit further includes a second magnetoresistive effect unit that detects a magnetic field in a second direction;
the second direction is a direction parallel to the first surface of the resin layer;
the inclined surfaces comprise one inclined surface is formed in the first surface of the resin layer; and
the first magnetoresistive effect unit and the second magnetoresistive effect unit are provided on the one inclined surface.

3. The magnetic sensor according to claim 1, wherein:
the magnetoresistive effect unit further includes a second magnetoresistive effect unit that detects a magnetic field in a second direction;
the second direction is a direction parallel to the first surface of the resin layer;
the inclined surface includes a first inclined surface and a second inclined surface having different inclination directions from each other; and
the first magnetoresistive effect unit and the second magnetoresistive effect unit are provided on the first inclined surface or the second inclined surface.

4. The magnetic sensor according to claim 1, wherein:
the magnetoresistive effect unit further includes a second magnetoresistive effect unit that detects a magnetic field in a second direction;
the second direction is a direction parallel to the first surface of the resin layer;
the inclined surface includes a first inclined surface and a second inclined surface having different inclination directions from each other;
the first magnetoresistive effect unit is provided on the first inclined surface; and
the second magnetoresistive effect unit is provided on the second inclined surface.

5. The magnetic sensor according to claim 3, wherein one side of the outer periphery of the first inclined surface and one side of the outer periphery of the second inclined surface are shared.

6. The magnetic sensor according to claim 3, wherein:
the magnetoresistive effect unit further includes a third magnetoresistive effect unit that detects the magnetic field in a third direction;
the third direction is a direction parallel to the first surface of the resin layer and is a direction orthogonal to the second direction;
the inclined surface further includes a third inclined surface with an inclination direction differing from both the inclination direction of the first inclined surface and the inclination direction of the second inclined surface; and
the third magnetoresistive effect unit is provided on the third inclined surface.

7. The magnetic sensor according to claim 6, wherein:
- one side of the outer periphery of the third inclined surface and one side of the outer periphery of the first inclined surface are shared; and
- one side of the outer periphery of the third inclined surface other than the one shared with the one side of the first inclined surface and one side of the outer periphery of the second inclined surface are shared.

8. The magnetic sensor according to claim 1, wherein the inclined surface is inclined from the first surface of the resin layer toward the second surface.

9. The magnetic sensor according to claim 1, wherein the inclined surface is inclined in a direction protruding from the first surface of the resin layer.

10. The magnetic sensor according to claim 1, wherein:
- the magnetoresistive effect unit includes a magnetoresistive effect element having at least an antiferromagnetic layer made of an antiferromagnetic material;
- the resin layer is made of a thermoplastic resin; and
- the softening temperature of the thermoplastic resin is lower than the Néel temperature of the antiferromagnetic material.

11. The magnetic sensor according to claim 1, further comprising a substrate having a first surface and a second surface, which is opposite to the first surface; wherein
- the resin layer is provided on the first surface of the substrate; and
- the second surface of the resin layer is located closer to the first surface side of the substrate than the first surface of the resin layer.

12. The magnetic sensor according to claim 11, wherein the substrate is a silicon substrate.

13. The magnetic sensor according to claim 1, further comprising a sealing unit that integrally seals the resin layer and the magnetoresistive effect unit.

14. A method of manufacturing a magnetic sensor including:
- a step for forming a resin material layer having a first surface and a second surface, which is opposite to the first surface;
- a step for providing a magnetoresistive effect unit on the first surface of the resin material layer; and
- a step for forming an inclined surface inclined at a predetermined angle with respect to the first surface, on the first surface of the resin material layer;
- wherein the magnetoresistive effect unit includes at least a first magnetoresistive effect unit that detects a magnetic field in a first direction;
- the first direction is a direction orthogonal to the first surface of the resin layer; and
- the inclined surface is formed so that the first magnetoresistive effect unit provided on the first surface of the resin layer is positioned on the inclined surface.

15. A method of manufacturing a magnetic sensor including:
- a step for forming a resin material layer having a first surface and a second surface, which is opposite to the first surface;
- a step for forming an inclined surface inclined at a predetermined angle with respect to the first surface, on the first surface of the resin material layer; and
- a step for providing a magnetoresistive effect unit on the inclined surface;
- wherein the magnetoresistive effect unit includes at least a first magnetoresistive effect unit that detects a magnetic field in a first direction; and
- the first direction is a direction orthogonal to the first surface of the resin layer.

16. The method of manufacturing a magnetic sensor according to claim 15, wherein:
- the magnetoresistive effect unit further includes a second magnetoresistive effect unit that detects a magnetic field in a second direction;
- the second direction is a direction parallel to the first surface of the resin layer;
- the inclined surface includes a first inclined surface and a second inclined surface with inclination directions different from each other; and
- the first magnetoresistive effect unit is provided on the first inclined surface and the second magnetoresistive effect unit is provided on the second inclined surface.

17. The method of manufacturing a magnetic sensor according to claim 15, wherein:
- the magnetoresistive effect unit further includes a third second magnetoresistive effect unit that detects a magnetic field in a third direction;
- the third direction is a direction parallel to the first surface of the resin layer, and is a direction orthogonal to the second direction;
- the inclined surface further includes a third inclined surface with an inclination direction differing from both the inclination direction of the first inclined surface and the inclination direction of the second inclined surface; and
- the third magnetoresistive effect unit is provided on the third inclined surface.

18. The method of manufacturing a magnetic sensor according to claim 15, wherein:
- the resin material layer is made of a thermoplastic resin; and
- the inclined surface is formed by softening the thermoplastic resin and then pressing a template having an uneven surface including an inclined surface corresponding to the inclined surface into the resin material layer.

19. The method of manufacturing a magnetic sensor according to claim 18, wherein:
- the magnetoresistive effect unit includes a magnetoresistive effect element having at least an antiferromagnetic layer made of an antiferromagnetic material;
- the softening temperature of the thermoplastic resin is lower than the Neel temperature of the antiferromagnetic material; and
- the thermoplastic resin is softened by heating to a temperature that is at least as great as the softening temperature of the thermoplastic resin and less than the Neel temperature of the antiferromagnetic material.

20. The method of manufacturing a magnetic sensor according to claim 15, further including a step for preparing a substrate having a first surface and a second surface, which is opposite to the first surface;
- wherein the resin material layer is formed on the first surface of the substrate.

* * * * *